(12) United States Patent
Sullivan et al.

(10) Patent No.: US 8,107,571 B2
(45) Date of Patent: Jan. 31, 2012

(54) PARAMETERIZED FILTERS AND SIGNALING TECHNIQUES

(75) Inventors: Gary J. Sullivan, Redmond, WA (US); Sridhar Srinivasan, Shanghai (CN); Shankar Regunathan, Bellevue, WA (US); Chengjie Tu, Sammamish, WA (US)

(73) Assignee: Microsoft Corporation, Redmond, WA (US)

( * ) Notice: Subject to any disclaimer, the term of this patent is extended or adjusted under 35 U.S.C. 154(b) by 885 days.

(21) Appl. No.: 11/726,395

(22) Filed: Mar. 20, 2007

(65) Prior Publication Data

US 2008/0232452 A1 Sep. 25, 2008

(51) Int. Cl.
*H04B 1/10* (2006.01)
(52) U.S. Cl. ...................................... 375/350
(58) Field of Classification Search .................. 375/350
See application file for complete search history.

(56) References Cited

U.S. PATENT DOCUMENTS

| | | | |
|---|---|---|---|
| 5,300,949 A | 4/1994 | Rodriquez et al. |
| 5,414,469 A | 5/1995 | Gonzales et al. |
| 5,611,038 A | 3/1997 | Shaw et al. |
| 5,764,296 A | 6/1998 | Shin |
| RE35,910 E | 9/1998 | Nagata et al. |
| 5,821,986 A | 10/1998 | Yuan et al. |
| 5,828,421 A | 10/1998 | Boyce et al. |
| 5,864,637 A | 1/1999 | Liu et al. |
| 5,970,173 A | 10/1999 | Lee et al. |
| 6,002,801 A | 12/1999 | Strongin et al. |
| 6,014,694 A | 1/2000 | Aharoni et al. |
| 6,104,434 A | 8/2000 | Nakagawa et al. |
| 6,157,396 A | 12/2000 | Margulis et al. |
| 6,239,847 B1 | 5/2001 | Deierling |
| 6,259,741 B1 | 7/2001 | Chen et al. |
| 6,324,301 B1 | 11/2001 | Jacquin et al. |
| 6,339,434 B1 | 1/2002 | West et al. |
| 6,418,166 B1 | 7/2002 | Wu et al. |
| 6,456,663 B1 | 9/2002 | Kim |
| 6,499,060 B1 | 12/2002 | Wang et al. |
| 6,501,484 B1 | 12/2002 | Porter |
| 6,510,177 B1 | 1/2003 | De Bonet et al. |

(Continued)

FOREIGN PATENT DOCUMENTS

EP  1 401 211  3/2004

(Continued)

OTHER PUBLICATIONS

Anonymous, "DivX Multi Standard Video Encoder," 2 pp.

(Continued)

*Primary Examiner* — Kevin Kim
(74) *Attorney, Agent, or Firm* — Klarquist Sparkman, LLP

(57) ABSTRACT

Filter taps for filters are specified by filter coefficient parameters. The filter taps are greater in number than the coefficient parameters from which the filter taps are calculated. For example, two coefficient parameters are used to specify a four-tap filter. Filter information can be signaled in a bitstream, such as by signaling one or more family parameters for a filter family and, for each filter in a family, signaling one or more filter tap parameters from which filter taps can be derived. Family parameters can include a number of filters parameter, a resolution parameter, a scaling bits parameter, and/or a full integer position filter present parameter that indicates whether or not the filters include an integer position filter. Filter parameters can be signaled and used to determine coefficient parameters from which filter taps are calculated.

31 Claims, 11 Drawing Sheets

U.S. PATENT DOCUMENTS

| | | | |
|---|---|---|---|
| 6,600,785 | B1 | 7/2003 | Nishigori et al. |
| 6,728,317 | B1 | 4/2004 | Demos |
| 6,823,014 | B2 | 11/2004 | Kim |
| 6,937,291 | B1 | 8/2005 | Gryskiewicz |
| 7,039,115 | B1 | 5/2006 | Wu et al. |
| 7,236,526 | B1 | 6/2007 | Kitamura |
| 7,375,767 | B2 | 5/2008 | Lee et al. |
| 7,379,496 | B2 | 5/2008 | Holcomb et al. |
| 7,756,350 | B2 * | 7/2010 | Vos et al. ............. 382/248 |
| 7,822,123 | B2 | 10/2010 | Lin et al. |
| 7,839,933 | B2 | 11/2010 | Lin et al. |
| 2002/0064226 | A1 | 5/2002 | Bauer et al. |
| 2002/0186890 | A1 | 12/2002 | Lee et al. |
| 2003/0161401 | A1 | 8/2003 | Shen et al. |
| 2003/0185306 | A1 | 10/2003 | MacInnis et al. |
| 2004/0013195 | A1 | 1/2004 | Panusopone et al. |
| 2004/0042549 | A1 | 3/2004 | Huang et al. |
| 2004/0062307 | A1 | 4/2004 | Hallapuro et al. |
| 2004/0091174 | A1 | 5/2004 | Wang et al. |
| 2004/0161035 | A1 | 8/2004 | Wedi |
| 2004/0213345 | A1 | 10/2004 | Holcomb et al. |
| 2005/0105611 | A1 | 5/2005 | Bjontegaard |
| 2005/0105617 | A1 * | 5/2005 | Chono ............. 375/240.16 |
| 2005/0190867 | A1 * | 9/2005 | Sobchak et al. ......... 375/346 |
| 2005/0196073 | A1 | 9/2005 | MacInnis et al. |
| 2005/0207496 | A1 | 9/2005 | Komiya et al. |
| 2006/0072672 | A1 | 4/2006 | Lin et al. |
| 2006/0072673 | A1 | 4/2006 | Lin et al. |
| 2006/0093036 | A1 | 5/2006 | Park et al. |
| 2006/0104349 | A1 | 5/2006 | Joch et al. |
| 2006/0120614 | A1 | 6/2006 | Flierl et al. |
| 2006/0210185 | A1 | 9/2006 | Sun |
| 2006/0222083 | A1 | 10/2006 | Klein et al. |
| 2007/0098079 | A1 | 5/2007 | Boyce et al. |
| 2007/0160153 | A1 | 7/2007 | Sullivan |

FOREIGN PATENT DOCUMENTS

| | | |
|---|---|---|
| EP | 1 617 672 | 1/2006 |
| JP | 4-207684 | 7/1992 |
| JP | 2000-134618 | 5/2000 |
| JP | 2000-165866 | 6/2000 |
| RU | 2191469 | 10/2002 |
| SU | 1506554 | 9/1989 |
| WO | WO 98/41029 | 9/1998 |
| WO | WO 00/33581 | 6/2000 |
| WO | WO 01/95633 | 12/2001 |
| WO | WO 02/054777 | 7/2002 |
| WO | WO 03/007619 | 1/2003 |
| WO | WO 2006/006777 | 1/2006 |
| WO | WO 2006/109135 | 10/2006 |
| WO | WO 2006/112620 | 10/2006 |

OTHER PUBLICATIONS

Beerman et al., "Low-complexity Spatial Up-scaling Methods for Low-resolution Video Coding," 6 pp. (2004).

Brainard et al., "Composite Television Coding: Subsampling and Interpolation," *SMPTE Journal*, pp. 717-724 (Aug. 1982).

Catmull et al., "A Class of Local Interpolating Splines," Computer Aided Geometric Design, Academic Press, pp. 317-326 (1974).

Dufaux et al., "Motion-compensated generic coding of video based on a multi resolution data structure," *Optical Engineering*, vol. 32, No. 7, pp. 1559-1570 (Jul. 1993).

Einarsson et al., "Mixed Resolution Video Coding for Low Bit-Rate Channels," *Proc. Int'l Workshop on Coding Techniques for Very Low Bit-Rate Video: VLBV97*, Linköping, Sweden, pp. 77-80 (Jul. 1997).

ISO/IEC, "ISO/IEC 11172-2: Information Technology—Coding of Moving Pictures and Associated Audio for Storage Media at up to About 1.5 Mbit/s," 122 pp. (1993).

ISO/IEC, "Information Technology—Coding of Audio-Visual Objects: Visual, ISO/IEC 14496-2, Committee Draft," 330 pp. (1998).

ITU, Recommendation H.261, "Line Transmission of Non-Telephone Signals," 28 pp. (Mar. 1993).—also cited as: ITU-T, "ITU-T Recommendation H.261: Video Codec for Audiovisual Services at $p$ x 64 kbits," 28 pp. (1993).

ITU, Recommendation H.262, "Transmission of Non-Telephone Signals," 211 pp. (Jul. 1995).—also cited as: ITU-T, "ITU-T Recommendation H.262: Information Technology—Generic Coding of Moving Pictures and Associated Audio Information: Video," 218 pp. (1995).

ITU, Recommendation H.263, "Video Coding for Low Bit Rate Communication," 167 pp. (Feb. 1998).—also cited as: ITU-T, "ITU-T Recommendation H.263: Video Coding for Low Bit Rate Communication," 167 pp. (1998).

Iwahashi et al., "A Motion Compensation Technique for Downscaled Pictures in Layered Coding," *IEICE Transactions on Comm.*, vol. E77-B, No. 8, pp. 1007-1012 (Aug. 1994).

Joint Video Team (JVT) of ISO/IEC MPEG & ITU-T VCEG, "Joint Final Committee Draft (JFCD) of Joint Video Specification," JVT-D157, 207 pp. (Aug. 2002).

Joint Video Team (JVT) of ISO/IEC MPEG and ITU-T VCEG, "Draft of Joint Scalable Video Model JSVM-4 Annex G," JVT-Q201, Nice, France, 166 pp. (Oct. 2005).

Joint Video Team (JVT) of ISO/IEC MPEG and ITU-T VCEG, "Joint Draft 7 of SVC Amendment (revision 2)," JVT-T201r2, Annex G, Klagenfurt, Austria, pp. i-xvii, 353-540 (Jul. 2006).

Keys, "Cubic Convolution Interpolation for Digital Image Processing," Computer Graphics, vol. ASSP-29, No. 6, pp. 1153-1160 (Dec. 1981).

Kwon et al., "Adaptive Bitrate Allocation in Spatial Scalable Video Coding of Fixed Total Bitrate," *IEICE Trans. Fundamentals*, vol. E81-A, No. 5, pp. 950-956 (May 1998).

Meijering, "A Chronology of Interpolation: From Ancient Astronomy to Modern Signal and Image Processing," *IEEE*, vol. 90, No. 3, pp. 319-342 (Mar. 2002).

Meijering, "Prolog to a Chronology of Interpolation: From Ancient Astronomy to Modern Signal and Image Processing," *IEEE*, vol. 90, No. 3, pp. 317-318 (Mar. 2002).

Meijering et al., "A Note on Cubic Convolution Interpolation," *IEEE Transactions on Image Processing*, vol. 12, No. 4, pp. 477-479 (Apr. 2003).

Mitchell et al., "Reconstruction Filters in Computer Graphics," Computer Graphics, vol. 22, No. 4 pp. 221-228 (Aug. 1988).

Printouts of FTP directories from http://ftp3.itu.ch, 8 pp. (downloaded from the World Wide Web on Sep. 20, 2005).

Reader, "History of MPEG Video Compression—Ver. 4.0," 99 pp. (document marked Dec. 16, 2003).

Regunathan, "Flexible 4-tap Filters for Texture Upsampling in Spatial Scalability," JVT-U123, Hangzhou, China, 10 pp. (Oct. 2006).

Regunathan, "Flexible 4-tap Filters for Texture Upsampling in Spatial Scalability," JVT-V074, Marrakech, Morocco, 14 pp. (Jan. 2007).

Segall et al., "Adaptive Upsampling for Spatially Scalable Coding," JVT-0010, Busan, KR, 10 pp. (Apr. 2005).

Segall, "Study of Upsampling/Downsampling for Spatial Scalability," JVT-Q083, Nice, France, 18 pp. (Oct. 2005).

Segall, "CE4: Evaluation of Texture Upsampling with 4-tap Cubic-Spline Filter," JVT-U042, Hangzhou, China, 6 pp. (Oct. 2006).

Srinivasan et al., "Windows Media Video 9: Overview and applications," *Signal Processing: Image Communication*, vol. 19, No. 9, pp. 851-875 (Oct. 2004).

Sullivan, "Color Format Upconversion for Video Display," JVT-1019, San Diego, 6 pp. (Sep. 2003).

Sullivan et al., "The H.264/AVC Advanced Video Coding Standard: Overview and Introduction to the Fidelity Range Extensions," 21 pp. (Aug. 2004).

Sullivan, "Position Calculation for SVC Upsampling," JVT-R067, Bangkok, Thailand, 7 pp. (Jan. 2006).

Sullivan et al., "Position Calculation for SVC Upsampling," JVT-S067, Geneva, Switzerland, 12 pp. (Mar. 2006).

Sullivan, "Position Calculation for SVC Upsampling," JVT-U067, Hangzhou, China, 7 pp. (Oct. 2006).

Sullivan, "Resampling Filters for SVC Upsampling," JVT-R066, Meeting: Bangkok, Thailand, 9 pp. (Jan. 2006).

Sun et al., "Unified Solution for Spatial Scalability," JVT-R018, Bangkok, Thailand, 6 pp. (Jan. 2006).

Sun, "Texture Upsampling with 4-tap Cubic-Spline Filter," JVT-T057r1, Klagenfurt, Austria, 8 pp. (Jul. 2006).

Sun, "Upsampling Filter Design with Cubic Splines," JVT-S016, Geneva, Switzerland, 9 pp. (Mar.-Apr. 2006).

Tu et al., "CE4: 4-tap Motion Compensation Interpolation Filter for High Resolution SVC Enhancement Layers," JVT-W068, 9 pp. (Apr. 2007).

Volleberg et al., "Generic Topology for FIR Filter Based Up- and Down-Sampling," 4 pp. (Apr. 2004).

Wedi, "Adaptive Interpolation Filter for Motion Compensated Hybrid Video Coding," *Picture Coding Symposium*, 4 pp. (Apr. 2001).

Wedi, "Adaptive Interpolation Filter for Motion Compensated Prediction," *IEEE*, 4 pp. (Dec. 2002).

Wedi, "Adaptive Interpolation Filters and High-Resolution Displacements for Video Coding," *IEEE Trans. on Circuits and Systems for Video Technology*, pp. 484-491 (Apr. 2006).

Wien, "Variable Block-Size Transforms for Hybrid Video Coding," Dissertation, 182 pp. (Feb. 2004).

\* cited by examiner

Software 180 implementing video encoder
or decoder with described video encoding
and decoding techniques and tools Figure 4
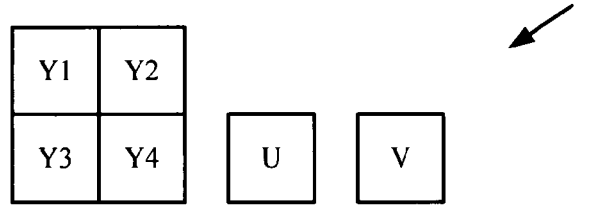
Figure 5A          Figure 5B
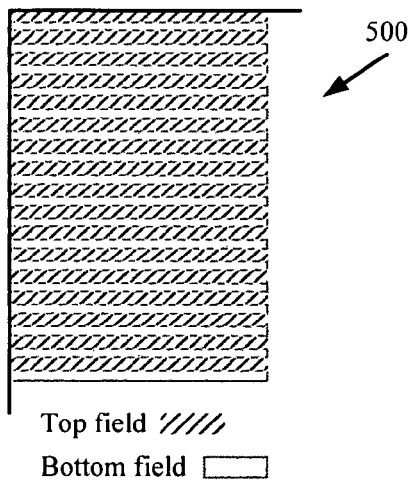 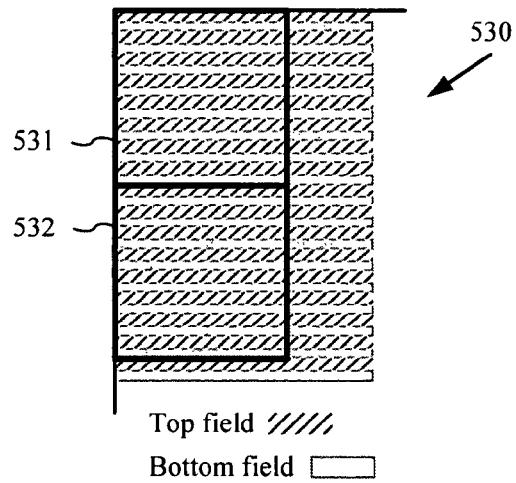
Figure 5C
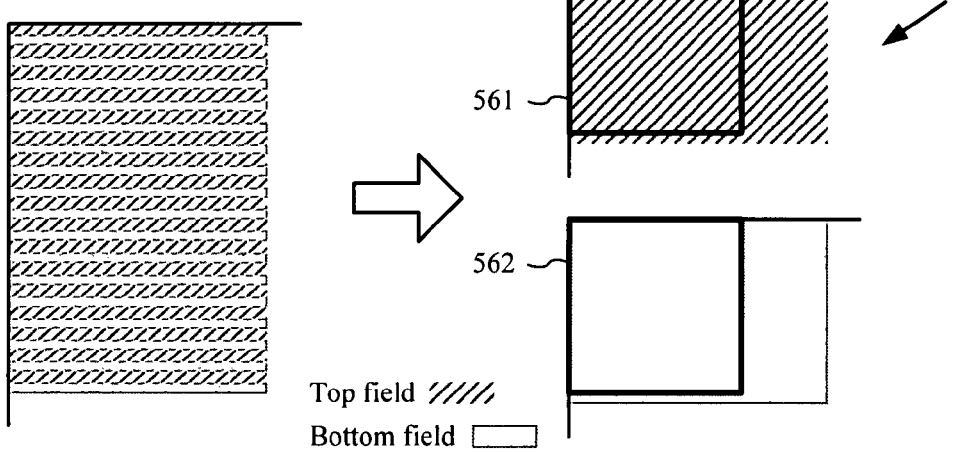

PARAMETERIZED FILTERS AND SIGNALING TECHNIQUES

BACKGROUND

With the increased popularity of DVDs, music delivery over the Internet, and digital cameras, digital media have become commonplace. Engineers use a variety of techniques to process digital audio, video, and images efficiently while still maintaining quality. To understand these techniques, it helps to understand how the audio, video, and image information is represented and processed in a computer.

I. Representation of Media Information in a Computer

A computer processes media information as a series of numbers representing that information. For example, a single number may represent the intensity of brightness or the intensity of a color component such as red, green or blue for each elementary small region of a picture, so that the digital representation of the picture consists of one or more arrays of such numbers. Each such number may be referred to as a sample. For a color image, it is conventional to use more than one sample to represent the color of each elemental region, and typically three samples are used. The set of these samples for an elemental region may be referred to as a pixel, where the word "pixel" is a contraction referring to the concept of a "picture element." For example, one pixel may consist of three samples that represent the intensity of red, green and blue light necessary to represent the elemental region. Such a pixel type is referred to as an RGB pixel. Several factors affect quality of media information, including sample depth, resolution, and frame rate (for video).

Sample depth is a property normally measured in bits that indicates the range of numbers that can be used to represent a sample. When more values are possible for the sample, quality can be higher because the number can capture more subtle variations in intensity and/or a greater range of values. Resolution generally refers to the number of samples over some duration of time (for audio or video) or space (for images or individual video pictures). Images with higher spatial resolution tend to look crisper than other images and contain more discernable useful details. Frame rate is a common term for temporal resolution for video. Video with higher frame rate tends to mimic the smooth motion of natural objects better than other video, and can similarly be considered to contain more detail in the temporal dimension. For all of these factors, the tradeoff for high quality is the cost of storing and transmitting the information in terms of the bit rate necessary to represent the sample depth, resolution and frame rate, as Table 1 shows.

TABLE 1

Bit rates for different quality levels of raw video

| Bits Per Pixel (sample depth times samples per pixel) | Resolution (in pixels, Width × Height) | Frame Rate (in frames per second) | Bit Rate (in millions of bits per second) |
| --- | --- | --- | --- |
| 8 (value 0-255, monochrome) | 160 × 120 | 7.5 | 1.2 |
| 24 (value 0-255, RGB) | 320 × 240 | 15 | 27.6 |
| 24 (value 0-255, RGB) | 640 × 480 | 30 | 221.2 |
| 24 (value 0-255, RGB) | 1280 × 720 | 60 | 1327.1 |

Despite the high bit rate necessary for storing and sending high quality video (such as HDTV), companies and consumers increasingly depend on computers to create, distribute, and play back high quality content. For this reason, engineers use compression (also called source coding or source encoding) to reduce the bit rate of digital media. Compression decreases the cost of storing and transmitting the information by converting the information into a lower bit rate form. Compression can be lossless, in which quality of the video does not suffer but decreases in bit rate are limited by the complexity of the video. Or, compression can be lossy, in which quality of the video suffers but decreases in bit rate are more dramatic. Decompression (also called decoding) reconstructs a version of the original information from the compressed form. A "codec" is an encoder/decoder system.

In general, video compression techniques include "intra" compression and "inter" or predictive compression. For video pictures, intra compression techniques compress individual pictures. Inter compression techniques compress pictures with reference to preceding and/or following pictures.

II. Multi-Resolution Video and Spatial Scalability

Standard video encoders can experience a dramatic degradation in performance when the target bit rate falls below a certain threshold. Quantization and other lossy processing stages introduce distortion. At low bit rates, high frequency information may be heavily distorted or completely lost. As a result, significant artifacts can arise and cause a substantial drop in the quality of the reconstructed video. Although available bit rates increase as transmission and processing technology improves, maintaining high visual quality at constrained bit rates remains a primary goal of video codec design. Existing codecs use several methods to improve visual quality at constrained bit rates.

Multi-resolution coding allows encoding of video at different spatial resolutions. Reduced resolution video can be encoded at a substantially lower bit rate, at the expense of lost information. For example, a prior video encoder can downsample (using a downsampling filter) full-resolution video and encode it at a reduced resolution in the vertical and/or horizontal directions. Reducing the resolution in each direction by half reduces the dimensions of the encoded picture size by half. The encoder signals the reduced resolution coding to a decoder. The decoder receives information indicating reduced-resolution encoding and ascertains from the received information how the reduced-resolution video should be upsampled (horizontally and/or vertically using an upsampling filter) to increase the picture size before display. However, the information that was lost when the encoder downsampled and encoded the video pictures is still missing from the upsampled pictures.

Spatially scalable video uses a multi-layer approach, allowing an encoder to reduce spatial resolution (and thus bit rate) in a base layer while retaining higher resolution information from the source video in one or more enhancement layers. For example, a base layer intra picture can be coded at a reduced resolution, while an accompanying enhancement layer intra picture can retain higher resolution information from the source video. Similarly, base layer predicted pictures can be accompanied by enhancement layer predicted pictures. A decoder can choose (based on bit rate constraints and/or other criteria) to decode only base layer pictures at the lower resolution to obtain lower resolution reconstructed pictures, or to decode base layer and enhancement layer information to obtain higher resolution reconstructed pictures. When the base layer is encoded at a lower resolution than the displayed picture, the encoded picture size is actually smaller than the displayed picture. The decoder performs calculations to resize the reconstructed picture and uses upsampling filters to produce interpolated sample values at appropriate positions in the reconstructed picture.

Given the critical importance of video compression and decompression to digital video, it is not surprising that video compression and decompression are richly developed fields. Whatever the benefits of previous video compression and decompression techniques, however, they do not have the advantages of the following techniques and tools.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In summary, the Detailed Description is directed to various techniques and tools for selecting and parameterizing filters (e.g., resampling filters for spatially scalable video coding and decoding).

In one aspect, filter information is received for one or more filters (e.g., sub-sample resolution filters for filtering video information). For each of the filters (which may have different phases or fractional sample delays within a filter family), filter taps are calculated using the filter information. The filter taps are specified by one or more filter coefficient parameters. The filter taps are greater in number than the coefficient parameters from which the filter taps are calculated. For example, two coefficient parameters can be used to specify a four-tap filter. The coefficient parameters can be calculated by identifying a constraint for the filter and, based on the identified constraint, identifying the coefficient parameters. For example, a constraint matrix constrains the filter to be a linear interpolator. The filter information can include one or more filter family parameters (e.g., a number of filters parameter, a resolution parameter, a scaling bits parameter, and/or a full integer position filter present parameter that indicates whether or not the filters include an integer position filter) and signaled filter parameters used to determine the coefficient parameters from which the filter taps are calculated.

In another aspect, a method of upsampling spatially scalable video information comprises receiving upsampling filter information for upsampling filters (e.g., 1/16-sample resolution upsampling filters), determining at least two effective filter tap calculation parameters for each filter using the upsampling filter information, receiving encoded video sample information, and upsampling the video sample information using the filters. Each filter has at least four filter taps. The filter taps are calculated with the effective filter tap calculation parameters prior to the upsampling, and the filter taps are greater in number than the parameters from which the filter taps are calculated.

In another aspect, filter information is signaled in a bitstream. The filter information comprises information for a set of filters in a filter family. The signaling of the filter information comprises signaling one or more family parameters for the filter family and, for each of the filters, signaling one or more filter tap parameters from which filter taps can be derived. The filter tap parameters are fewer in number than the filter taps of the filter. The family parameters can include the number of filters in the set, a resolution parameter, a scaling bits parameter, and/or an integer position filter present parameter. One or more of the family parameters may be implied, rather than being explicitly signaled. Before signaling, filter tap parameters can be differentially coded (e.g., using second degree differential coding) relative to filter tap parameters of another filter, such that the signaled filter tap parameters are differentially coded values. The filter tap parameters can be fixed-length coded or variable-length coded. The filters may be usable for resampling, sub-sample interpolation in motion compensation, or another application. The filter family can further include mirrored filters each having filter taps derived from the filter taps of a filter for which filter information is signaled.

Additional features and advantages will be made apparent from the following detailed description of various embodiments that proceeds with reference to the accompanying drawings.

BRIEF DESCRIPTION OF THE DRAWINGS

FIG. 4 is a diagram of a macroblock format used in several described embodiments.

FIG. 5A is a diagram of part of an interlaced video frame, showing alternating lines of a top field and a bottom field.

FIG. 5B is a diagram of the interlaced video frame organized for encoding/decoding as a frame, and FIG. 5C is a diagram of the interlaced video frame organized for encoding/decoding as fields.

DETAILED DESCRIPTION

Described embodiments are directed to techniques and tools for selecting, parameterizing and signaling filters (e.g., resampling filters such as upsampling filters for spatially scalable video coding and decoding, sub-sample interpolation filters for motion compensation).

The various techniques and tools described herein may be used independently. Some of the techniques and tools may be used in combination (e.g., in different stages of a combined encoding and/or decoding process).

Various techniques are described below with reference to flowcharts of processing acts. The various processing acts shown in the flowcharts may be consolidated into fewer acts or separated into more acts. For the sake of simplicity, the relation of acts shown in a particular flowchart to acts described elsewhere is often not shown. In many cases, the acts in a flowchart can be reordered.

Much of the detailed description addresses representing, coding, and decoding video information. Techniques and tools described herein for representing, coding, and decoding video information may be applied to still image information or other media information.

I. Computing Environment

Figure 1:
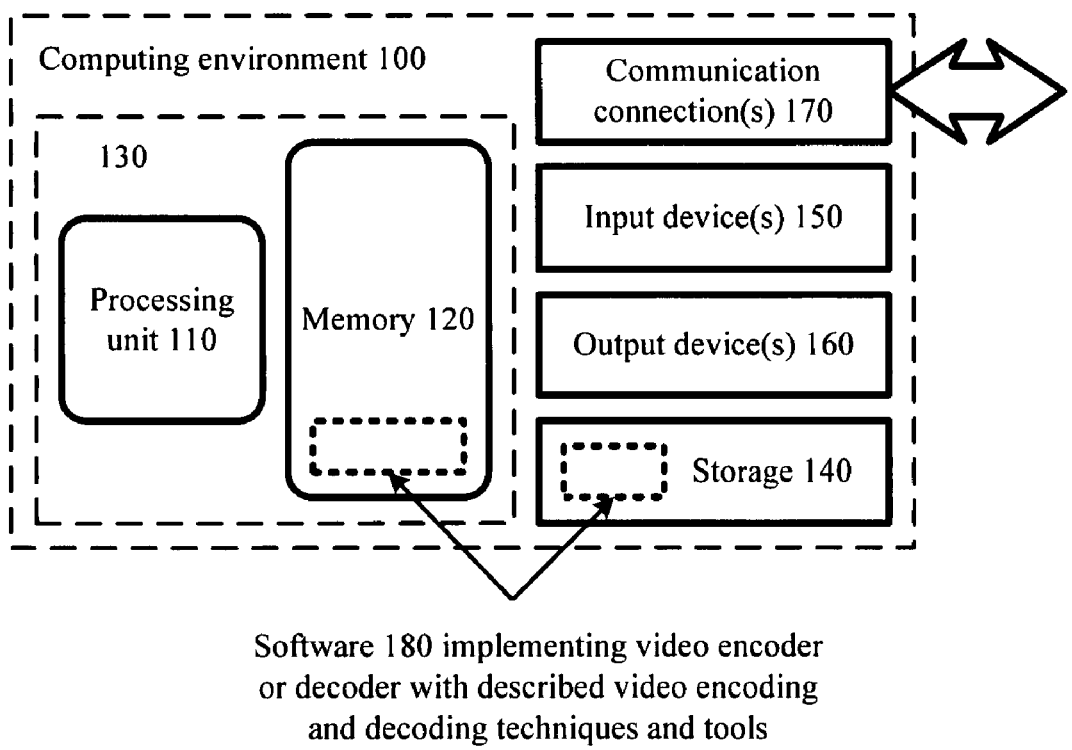
FIG. 1 is a block diagram of a suitable computing environment in conjunction with which several described embodiments may be implemented.

FIG. 1 illustrates a generalized example of a suitable computing environment (100) in which several of the described embodiments may be implemented. The computing environment (100) is not intended to suggest any limitation as to scope of use or functionality, as the techniques and tools may be implemented in diverse general-purpose or special-purpose computing environments.

With reference to FIG. 1, the computing environment (100) includes at least one processing unit (110) and memory (120). In FIG. 1, this most basic configuration (130) is included within a dashed line. The processing unit (110) executes computer-executable instructions and may be a real or a virtual processor. In a multi-processing system, multiple processing units execute computer-executable instructions to increase processing power. The memory (120) may be volatile memory (e.g., registers, cache, RAM), non-volatile memory (e.g., ROM, EEPROM, flash memory, etc.), or some combination of the two. The memory (120) stores software (180) implementing one or more of the described techniques and tools.

A computing environment may have additional features. For example, the computing environment (100) includes storage (140), one or more input devices (150), one or more output devices (160), and one or more communication connections (170). An interconnection mechanism (not shown) such as a bus, controller, or network interconnects the components of the computing environment (100). Typically, operating system software (not shown) provides an operating environment for other software executing in the computing environment (100), and coordinates activities of the components of the computing environment (100).

The storage (140) may be removable or non-removable, and includes magnetic disks, magnetic tapes or cassettes, CD-ROMs, DVDs, flash memory, or any other medium which can be used to store information and which can be accessed within the computing environment (100). The storage (140) stores instructions for the software (180).

The input device(s) (150) may be a touch input device such as a keyboard, mouse, pen, touch screen, or trackball, a voice input device, a scanning device, or another device that provides input to the computing environment (100). For audio or video encoding, the input device(s) (150) may be a sound card, video card, TV tuner card, or similar device that accepts audio or video input in analog or digital form, or a CD-ROM, CD-RW or DVD that reads audio or video samples into the computing environment (100). The output device(s) (160) may be a display, printer, speaker, CD- or DVD-writer, or another device that provides output from the computing environment (100).

The communication connection(s) (170) enable communication over a communication medium to another computing entity. The communication medium conveys information such as computer-executable instructions, audio or video input or output, or other data in a modulated data signal. A modulated data signal is a signal that has one or more of its characteristics set or changed in such a manner as to encode information in the signal. By way of example, and not limitation, communication media include wired or wireless techniques implemented with an electrical, optical, RF, infrared, acoustic, or other carrier.

The techniques and tools can be described in the general context of computer-readable media. Computer-readable media are any available media that can be accessed within a computing environment. By way of example, and not limitation, with the computing environment (100), computer-readable media include memory (120), storage (140), communication media, and combinations of any of the above.

The techniques and tools can be described in the general context of computer-executable instructions, such as those included in program modules, being executed in a computing environment on one or more target real processors or virtual processors. Generally, program modules include routines, programs, libraries, objects, classes, components, data structures, etc. that perform particular tasks or implement particular abstract data types. The functionality of the program modules may be combined or split between program modules as desired in various embodiments. Computer-executable instructions for program modules may be executed within a local or distributed computing environment.

For the sake of presentation, the detailed description uses terms like "select" and "choose" to describe computer operations in a computing environment. These terms are high-level abstractions for operations performed by a computer, and should not be confused with acts performed by a human being. The actual computer operations corresponding to these terms vary depending on implementation.

II. Example Video Encoder and Decoder

Figure 2:
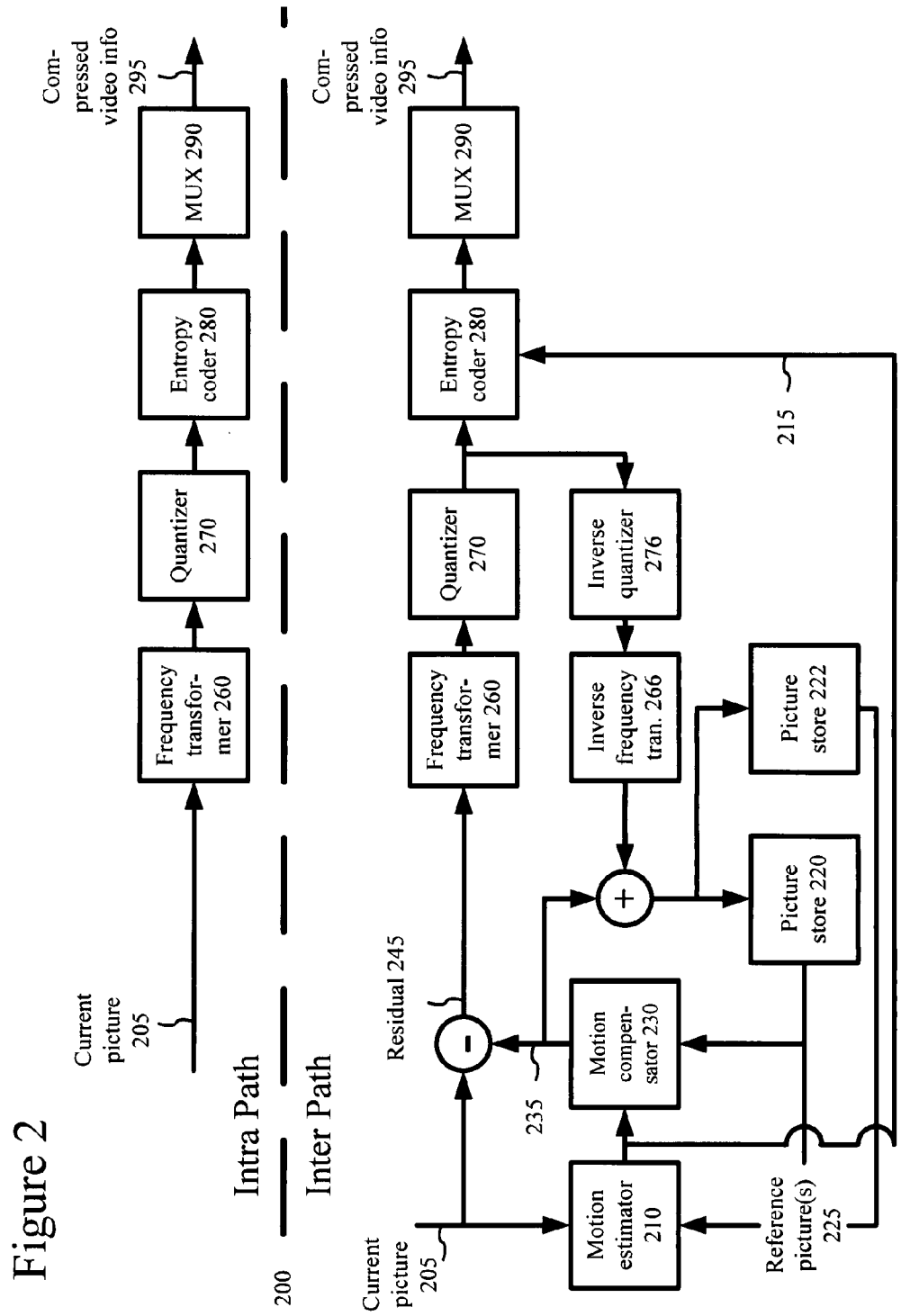
FIG. 2 is a block diagram of a generalized video encoder system in conjunction with which several described embodiments may be implemented.
Figure 3:
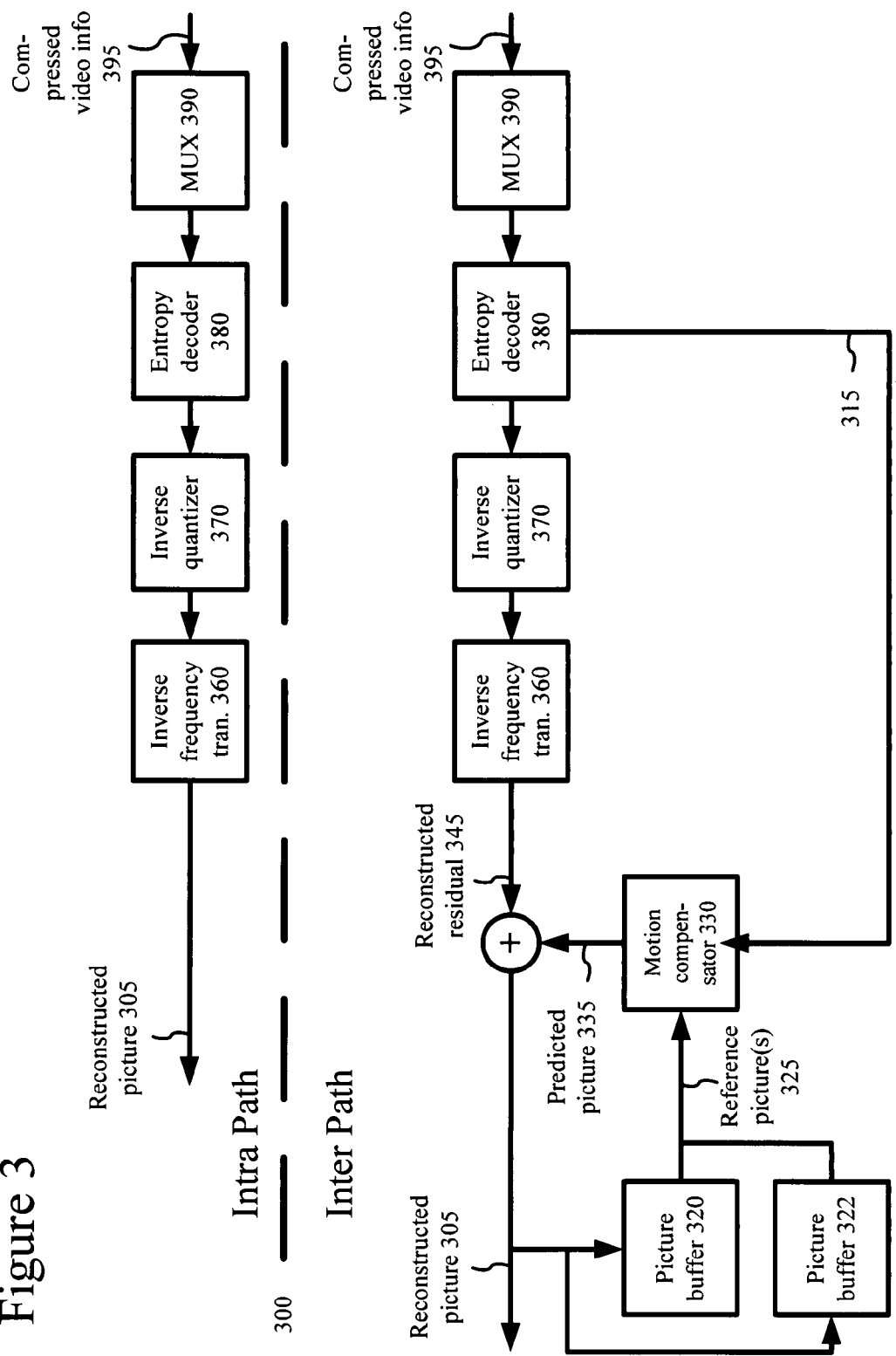
FIG. 3 is a block diagram of a generalized video decoder system in conjunction with which several described embodiments may be implemented.

FIG. 2 is a block diagram of an example video encoder (200) in conjunction with which some described embodiments may be implemented. FIG. 3 is a block diagram of a generalized video decoder (300) in conjunction with which some described embodiments may be implemented.

The relationships shown between modules within the encoder (200) and decoder (300) indicate general flows of information in the encoder and decoder; other relationships are not shown for the sake of simplicity. In particular, FIGS. 2 and 3 usually do not show side information indicating the encoder settings, modes, tables, etc. used for a video sequence, picture, slice, macroblock, block, etc. Such side information is sent in the output bitstream, typically after entropy encoding of the side information. The format of the output bitstream may vary depending on implementation.

The encoder (200) and decoder (300) process video pictures, which may be video frames, video fields or combinations of frames and fields. The bitstream syntax and semantics at the picture and macroblock levels may depend on whether frames or fields are used. There may be changes to macroblock organization and overall timing as well. The encoder (200) and decoder (300) are block-based and use a 4:2:0 macroblock format for frames, with each macroblock including four 8×8 luminance blocks (at times treated as one 16×16 macroblock) and two 8×8 chrominance blocks. For fields, the same or a different macroblock organization and format may be used. The 8×8 blocks may be further sub-divided at different stages, e.g., at the frequency transform and entropy encoding stages. Example video frame organizations are described in more detail below. Alternatively, the encoder (200) and decoder (300) are object-based, use a different macroblock or block format, or perform operations on sets of samples of different size or configuration than 8×8 blocks and 16×16 macroblocks.

Depending on implementation and the type of compression desired, modules of the encoder or decoder can be added, omitted, split into multiple modules, combined with other modules, and/or replaced with like modules. In alternative embodiments, encoders or decoders with different modules and/or other configurations of modules perform one or more of the described techniques.

A. Video Frame Organizations

In some implementations, the encoder (200) and decoder (300) process video frames organized as follows. A frame contains lines of spatial information of a video signal. For progressive video scanning, these lines contain samples representing a snapshot of scene content sampled at the same time instant and covering the entire scene from the top to the bottom of the frame. A progressive video frame is divided into macroblocks such as the macroblock (400) shown in FIG. 4. The macroblock (400) includes four 8×8 luminance blocks (Y1 through Y4) and two 8×8 chrominance blocks that are co-located with the four luminance blocks but half resolution horizontally and vertically, following the conventional 4:2:0 macroblock format. The 8×8 blocks may be further sub-divided at different stages, e.g., at the frequency transform (e.g., 8×4, 4×8 or 4×4 DCTs) and entropy encoding stages. A progressive I-frame is an intra-coded progressive video frame, where the term "intra" refers to coding methods that do not involve prediction from the content of other previously-decoded pictures. A progressive P-frame is a progressive video frame coded using prediction from one or more other pictures at time instances that temporally differ from that of the current picture (sometimes referred to as forward prediction in some contexts), and a progressive B-frame is a progressive video frame coded using inter-frame prediction involving a (possibly weighted) averaging of multiple prediction values in some regions (sometimes referred to as bi-predictive or bi-directional prediction). Progressive P- and B-frames may include intra-coded macroblocks as well as various types of inter-frame predicted macroblocks.

Interlaced video frame scanning consists of an alternating series of two types of scans of a scene—one, referred to as the top field, comprising the even lines (lines numbered 0, 2, 4, etc.) of a frame, and the other, referred to as the bottom field, comprising the odd lines (lines numbered 1, 3, 5, etc.) of the frame. The two fields typically represent two different snapshot time instants. FIG. 5A shows part of an interlaced video frame (500), including the alternating lines of the top field and bottom field at the top left part of the interlaced video frame (500).

FIG. 5B shows the interlaced video frame (500) of FIG. 5A organized for encoding/decoding as a frame (530). The interlaced video frame (500) has been partitioned into macroblocks or other such regions such as the macroblocks (531 and 532), which use a 4:2:0 format as shown in FIG. 4. In the luminance plane, each macroblock (531, 532) includes 8 lines from the top field alternating with 8 lines from the bottom field for 16 lines total, and each line is 16 samples long. (The actual organization of the picture into macroblocks or other such regions and the placement of luminance blocks and chrominance blocks within the macroblocks (531, 532) are not shown, and in fact may vary for different encoding decisions and for different video coding designs.) Within a given macroblock, the top-field information and bottom-field information may be coded jointly or separately at any of various stages.

An interlaced I-frame is an intra-coded interlaced video frame containing two fields, where each macroblock includes information for one or both fields. An interlaced P-frame is an interlaced video frame containing two fields that is coded using inter-frame prediction, where each macroblock includes information for one or both fields, as is an interlaced B-frame. Interlaced P- and B-frames may include intra-coded macroblocks as well as various types of inter-frame predicted macroblocks.

FIG. 5C shows the interlaced video frame (500) of FIG. 5A organized for encoding/decoding as fields (560). Each of the two fields of the interlaced video frame (500) is partitioned into macroblocks. The top field is partitioned into macroblocks such as the macroblock (561), and the bottom field is partitioned into macroblocks such as the macroblock (562). (Again, the macroblocks use a 4:2:0 format as shown in FIG. 4, and the organization of the picture into macroblocks or other such regions and placement of luminance blocks and chrominance blocks within the macroblocks are not shown and may vary.) In the luminance plane, the macroblock (561) includes 16 lines from the top field and the macroblock (562) includes 16 lines from the bottom field, and each line is 16 samples long.

An interlaced I-field is a single, separately represented field of an interlaced video frame. An interlaced P-field is a single, separately represented field of an interlaced video frame coded using inter-picture prediction, as is an interlaced B-field. Interlaced P- and B-fields may include intra-coded macroblocks as well as different types of inter-picture predicted macroblocks.

Interlaced video frames organized for encoding/decoding as fields may include various combinations of different field types. For example, such a frame may have the same field type (I-field, P-field, or B-field) in both the top and bottom fields or different field types in each field.

The term picture generally refers to a frame or field of source, coded or reconstructed image data. For progressive-scan video, a picture is typically a progressive video frame. For interlaced video, a picture may refer to an interlaced video frame, the top field of a frame, or the bottom field of a frame, depending on the context.

Alternatively, the encoder (200) and decoder (300) are object-based, use a different macroblock format (e.g., 4:2:2 or 4:4:4) or block format, or perform operations on sets of samples of different size or configuration than 8×8 blocks and 16×16 macroblocks.

B. Video Encoder

FIG. 2 is a block diagram of an example video encoder system (200). The encoder system (200) receives a sequence of video pictures including a current picture (205) (e.g., progressive video frame, interlaced video frame, or field of an interlaced video frame), and produces compressed video information (295) as output. Particular embodiments of video encoders typically use a variation or supplemented version of the example encoder (200).

The encoder system (200) uses encoding processes for intra-coded (intra) pictures (I-pictures) and inter-picture predicted (inter) pictures (P- or B-pictures). For the sake of presentation, FIG. 2 shows a path for I-pictures through the encoder system (200) and a path for inter-picture predicted pictures. Many of the components of the encoder system (200) are used for compressing both I-pictures and inter-picture predicted pictures. The exact operations performed by those components may vary depending on the type of information being compressed.

An inter-picture predicted picture is represented in terms of a prediction (or difference) from one or more other pictures (which are typically referred to as reference pictures). A prediction residual is the difference between what was predicted and the original picture. In contrast, an I-picture is compressed without reference to other pictures. I-pictures may use spatial prediction or frequency-domain prediction (i.e., intra-picture prediction) to predict some portions of the I-picture using data from other portions of the I-picture itself. However, for the sake of brevity, such I-pictures are not referred to in this description as "predicted" pictures, so that the phrase "predicted picture" can be understood to be an inter-picture predicted picture (e.g., a P- or B-picture).

If the current picture (205) is a predicted picture, a motion estimator (210) estimates motion of macroblocks or other sets of samples of the current picture (205) with respect to one or more reference pictures, for example, the reconstructed previous picture (225) buffered in the picture store (220). A motion estimator (210) may estimate motion with respect to one or more temporally previous reference pictures and one or more temporally future reference pictures (e.g., in the case of a bi-predictive picture). Accordingly, the encoder system (200) may use the separate stores (220) and (222) for multiple reference pictures.

The motion estimator (210) may estimate motion by full-sample, ½-sample, ¼-sample, or other increments, and may switch the resolution of the motion estimation on a picture-by-picture basis or other basis. The motion estimator (210) (and compensator (230)) also may switch between types of reference picture sample interpolation (e.g., between cubic convolution interpolation and bilinear interpolation) on a per-frame or other basis. The resolution of the motion estimation may be the same or different horizontally and vertically. The motion estimator (210) outputs, as side information, motion information (215) such as differential motion vector information. The encoder (200) encodes the motion information (215) by, for example, computing one or more predictors for motion vectors, computing differences between the motion vectors and predictors, and entropy coding the differences. To reconstruct a motion vector, a motion compensator (230) combines a predictor with motion vector difference information.

The motion compensator (230) applies the reconstructed motion vector to the reconstructed picture(s) (225) to form a motion-compensated prediction (235). The prediction is rarely perfect, however, and the difference between the motion-compensated prediction (235) and the original current picture (205) is the prediction residual (245). During later reconstruction of the picture, an approximation of the prediction residual (245) will be added to the motion compensated prediction (235) to obtain a reconstructed picture that is closer to the original current picture (205) than the motion-compensated prediction (235). In lossy compression, however, some information is still lost from the original current picture (205). Alternatively, a motion estimator and motion compensator apply another type of motion estimation/compensation.

A frequency transformer (260) converts the spatial domain video information into frequency domain (i.e., spectral) data. For block-based video coding, the frequency transformer (260) typically applies a discrete cosine transform (DCT), a variant of a DCT, or some other block transform to blocks of the sample data or prediction residual data, producing blocks of frequency-domain transform coefficients. Alternatively, the frequency transformer (260) applies another type of frequency transform such as a Fourier transform or uses wavelet or sub-band analysis. The frequency transformer (260) may apply an 8×8, 8×4, 4×8, 4×4 or other size frequency transform.

A quantizer (270) then quantizes the blocks of frequency-domain transform coefficients. The quantizer applies scalar quantization to the transform coefficients according to a quantization step-size that varies on a picture-by-picture basis, a macroblock basis, or some other basis, where the quantization step size is a control parameter that governs the uniformly-spaced spacing between discrete representable reconstruction points in the decoder inverse quantizer process, which may be duplicated in an encoder inverse quantizer process (276). Alternatively, the quantizer applies another type of quantization to the frequency-domain transform coefficients, for example, a scalar quantizer with non-uniform reconstruction points, a vector quantizer, or non-adaptive quantization, or directly quantizes spatial domain data in an encoder system that does not use frequency transformations. In addition to adaptive quantization, the encoder (200) may use frame dropping, adaptive filtering, or other techniques for rate control.

When a reconstructed current picture is needed for subsequent motion estimation/compensation, an inverse quantizer (276) performs inverse quantization on the quantized frequency-domain transform coefficients. An inverse frequency transformer (266) then performs the inverse of the operations of the frequency transformer (260), producing a reconstructed prediction residual approximation (for a predicted picture) or a reconstructed I-picture approximation. If the current picture (205) was an I-picture, the reconstructed I-picture approximation is taken as the reconstructed current picture approximation (not shown). If the current picture (205) was a predicted picture, the reconstructed prediction residual approximation is added to the motion-compensated prediction (235) to form the reconstructed current picture approximation. One or more of the picture stores (220, 222) buffers the reconstructed current picture approximation for use as a reference picture in motion compensated prediction of subsequent pictures. The encoder may apply a de-blocking filter or other picture refining process to the reconstructed frame to adaptively smooth discontinuities and remove other artifacts from the picture prior to storing the picture approximation into one or more picture stores (220, 222).

The entropy coder (280) compresses the output of the quantizer (270) as well as certain side information (e.g., motion information (215), quantization step size). Typical entropy coding techniques include arithmetic coding, differential coding, Huffman coding, run length coding, Lempel-Ziv coding, dictionary coding, and combinations of the above. The entropy coder (280) typically uses different coding techniques for different kinds of information (e.g., low-frequency coefficients, high-frequency coefficients, zero-frequency coefficients, different kinds of side information), and may choose from among multiple code tables within a particular coding technique.

The entropy coder (280) provides compressed video information (295) to the multiplexer ("MUX") (290). The MUX (290) may include a buffer, and a buffer fullness level indicator may be fed back to bit rate adaptive modules for rate control. Before or after the MUX (290), the compressed video information (295) may be channel coded for transmission over the network. The channel coding may apply error detection and correction data to the compressed video information (295).

C. Video Decoder

FIG. 3 is a block diagram of an example video decoder system (300). The decoder system (300) receives information (395) for a compressed sequence of video pictures and produces output including a reconstructed picture (305) (e.g., progressive video frame, interlaced video frame, or field of an interlaced video frame). Particular embodiments of video decoders typically use a variation or supplemented version of the generalized decoder (300).

The decoder system (300) decompresses predicted pictures and I-pictures. For the sake of presentation, FIG. 3 shows a path for I-pictures through the decoder system (300) and a path for predicted pictures. Many of the components of the decoder system (300) are used for decompressing both I-pictures and predicted pictures. The exact operations performed by those components may vary depending on the type of information being decompressed.

A DEMUX (390) receives the information (395) for the compressed video sequence and makes the received information available to the entropy decoder (380). The DEMUX (390) may include a jitter buffer and other buffers as well. Before or within the DEMUX (390), the compressed video information may be channel decoded and processed for error detection and correction.

The entropy decoder (380) entropy decodes entropy-coded quantized data as well as entropy-coded side information (e.g., motion information (315), quantization step size), typically applying the inverse of the entropy encoding performed in the encoder. Entropy decoding techniques include arithmetic decoding, differential decoding, Huffman decoding, run length decoding, Lempel-Ziv decoding, dictionary decoding, and combinations of the above. The entropy decoder (380) typically uses different decoding techniques for different kinds of information (e.g., low-frequency coefficients, high-frequency coefficients, zero-frequency coefficients, different kinds of side information), and may choose from among multiple code tables within a particular decoding technique.

The decoder (300) decodes the motion information (315) by, for example, computing one or more predictors for motion vectors, entropy decoding motion vector differences (at entropy decoder (380)), and combining decoded motion vector differences with predictors to reconstruct motion vectors.

A motion compensator (330) applies motion information (315) to one or more reference pictures (325) to form a prediction (335) of the picture (305) being reconstructed. For example, the motion compensator (330) uses one or more macroblock motion vectors to find blocks of samples or to interpolate fractional positions between samples in the reference picture(s) (325). One or more picture stores (e.g., picture store (320, 322)) store previous reconstructed pictures for use as reference pictures. Typically, B-pictures have more than one reference picture (e.g., at least one temporally previous reference picture and at least one temporally future reference picture). Accordingly, the decoder system (300) may use separate picture stores (320, 322) for multiple reference pictures. The motion compensator 330 may compensate for motion at full-sample, ½-sample, ¼-sample, or other increments, and may switch the resolution of the motion compensation on a picture-by-picture basis or other basis. The motion compensator (330) also may switch between types of reference picture sample interpolation (e.g., between cubic convolution interpolation and bilinear interpolation) on a per-frame or other basis. The resolution of the motion compensation may be the same or different horizontally and vertically. Alternatively, a motion compensator applies another type of motion compensation. The prediction by the motion compensator is rarely perfect, so the decoder (300) also reconstructs prediction residuals.

An inverse quantizer (370) inverse quantizes entropy-decoded data. Typically, the inverse quantizer applies uniform scalar inverse quantization to the entropy-decoded data with a reconstruction step-size that varies on a picture-by-picture basis, a macroblock basis, or some other basis. Alternatively, the inverse quantizer applies another type of inverse quantization to the data, for example, a non-uniform, vector, or non-adaptive inverse quantization, or directly inverse quantizes spatial domain data in a decoder system that does not use inverse frequency transformations.

An inverse frequency transformer (360) converts the inverse quantized frequency domain transform coefficients into spatial domain video information. For block-based video pictures, the inverse frequency transformer (360) applies an inverse DCT ("IDCT"), a variant of IDCT, or some other inverse block transform to blocks of the frequency transform coefficients, producing sample data or inter-picture prediction residual data for I-pictures or predicted pictures, respectively. Alternatively, the inverse frequency transformer (360) applies another type of inverse frequency transform such as an inverse Fourier transform or uses wavelet or sub-band synthesis. The inverse frequency transformer (360) may apply an 8×8, 8×4, 4×8, 4×4, or other size inverse frequency transform.

For a predicted picture, the decoder (300) combines the reconstructed prediction residual (345) with the motion compensated prediction (335) to form the reconstructed picture (305). When the decoder needs a reconstructed picture (305) for subsequent motion compensation, one or more of the picture stores (e.g., picture store (320)) buffers the reconstructed picture (305) for use in predicting the next picture. In some embodiments, the decoder (300) applies a de-blocking filter or other picture refining process to the reconstructed picture to adaptively smooth discontinuities and remove other artifacts from the picture prior to storing the reconstructed picture (305) into one or more of the picture stores (e.g., picture store (320)) or prior to displaying the decoded picture during decoded video play-out.

III. General Overview of Multi-Resolution Encoding and Decoding

Video can be encoded (and decoded) at different resolutions. For the purposes of this description, multi-resolution encoding and decoding is typically described as frame-based coding and decoding (e.g., reference picture resampling) or layered (sometimes referred to as spatial scalable) coding and decoding. Multi-resolution encoding and decoding could also involve interlaced video and field-based encoding and decoding and switching between frame-based and field-based encoding and decoding on a resolution-specific basis or on some other basis. However, frame coding of progressive video is typically discussed in this overview for purposes of simplifying the concept description, although some sections more generally address "picture" coding.

A. Frame-Based Multi-Resolution Encoding and Decoding

In frame-based multi-resolution coding, an encoder encodes input pictures at different resolutions. The encoder chooses the spatial resolution for pictures on a picture-by-picture basis or on some other basis. For example, in reference picture resampling, a reference picture can be resampled if it is encoded at a different resolution from that of the current picture being encoded. The term resampling is used to describe increasing (upsampling) or decreasing (downsampling) the number of samples used to represent a picture area or some other section of a sampled signal. The number of samples per unit area or per signal section is referred to as the resolution of the sampling.

Spatial resolution can be chosen based on, for example, an decrease/increase in available bit rate, decrease/increase in quantization step size, decrease/increase in the amount of motion in the input video content, other properties of the video content (e.g., presence of strong edges, text, or other content that may be significantly distorted at lower resolutions), or some other basis. Spatial resolution can be varied in vertical, horizontal, or both vertical and horizontal dimensions. Horizontal resolution may be the same as or different than vertical resolution. A decoder decodes encoded frames using complementary techniques.

Once the encoder has chosen a spatial resolution for a current picture or area within a current picture, the encoder re-samples the original picture to the desired resolution before coding it. The encoder can then signal the choice of spatial resolution to the decoder. Alternatively, the encoder sets resolutions at some level other than picture level, such as setting resolutions for a group or sequence of pictures.

Figure 6:
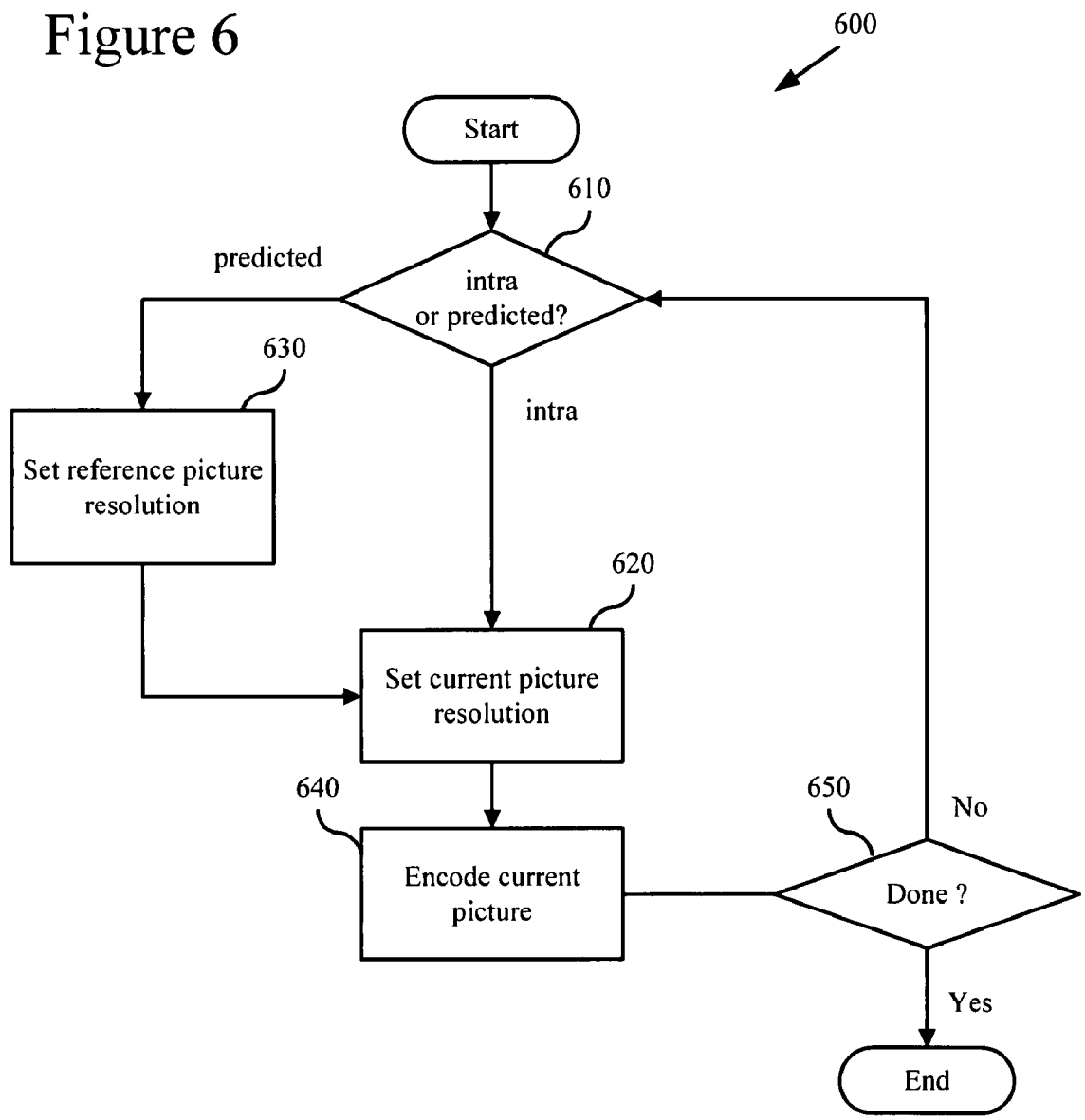
FIG. 6 is a flowchart showing a technique for multi-resolution encoding of intra pictures and inter-picture predicted pictures.

The encoder may encode predicted pictures as well as intra pictures. FIG. 6 shows a technique (600) for frame-based multi-resolution encoding of intra pictures and inter-picture predicted pictures. First, the encoder checks (610) whether the current picture to be encoded is an intra picture or a predicted picture. If the current picture is an intra picture, the encoder sets the resolution for the current picture (620). If the picture is a predicted picture, the encoder sets the resolution for the reference picture (630) before setting the resolution for the current picture. After setting the resolution for the current picture, the encoder encodes the current picture (640) at that resolution. Setting the resolution for a picture (whether a current source picture or a stored reference picture) may involve resampling the picture to match the selected resolution and may involve encoding a signal to indicate the selected resolution and corresponding resampling filters to the decoder (for example, using one of the approaches described below for parameterization and signaling of filter information). If the encoding of all pictures that are to be encoded is done (650), the encoder exits. If not, the encoder continues encoding additional pictures. Alternatively, the encoder treats predicted pictures in a different way.

A decoder decodes the encoded picture, and, if necessary, resamples the picture before display. Like the resolution of the encoded picture, the resolution of the decoded picture can be adjusted in many different ways. For example, the resolution of the decoded picture can be adjusted to fit the resolution of an output display device or of a region of an output display device (for example, for "picture-in-picture" or PC desktop window display). Alternatively, the decoder sets resolutions at some level other than picture level.

Figure 7:
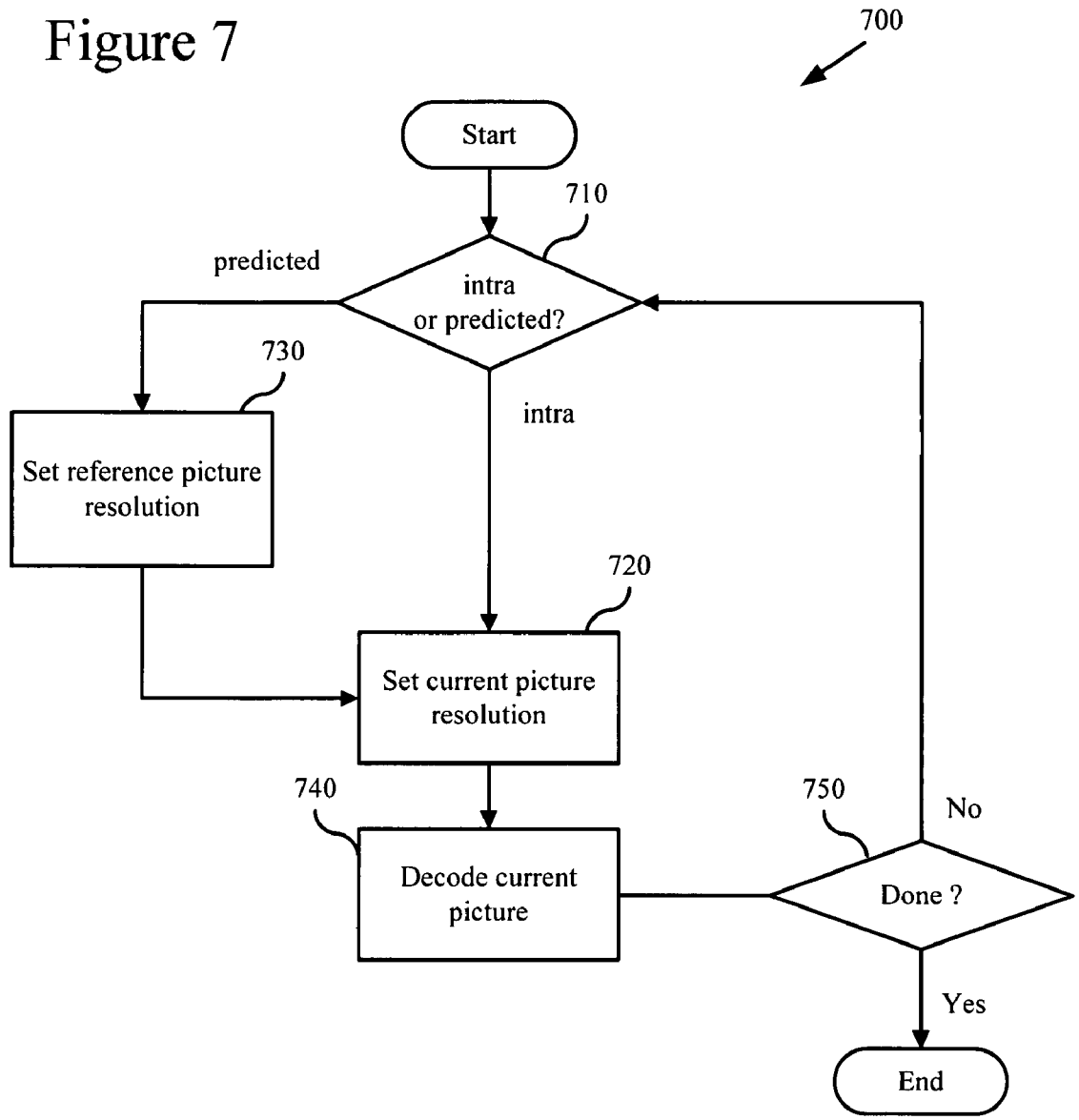
FIG. 7 is a flowchart showing a technique for multi-resolution decoding of intra pictures and inter-picture predicted pictures.

The decoder may decode predicted pictures as well as intra pictures. FIG. 7 shows a technique (700) for frame-based multi-resolution decoding of intra pictures and predicted pictures. First, when such information is signaled, the decoder receives and reconstruction information indicating resolution decisions and/or resampling filters to use. The decoder checks whether the current frame to be decoded is an intra picture or a predicted picture (710). If the current picture is an intra picture, the decoder sets the resolution for the current picture (720). If the picture is a predicted picture, the decoder sets the resolution for the reference picture (730) before setting the resolution for the current picture (720). Setting the resolution of the reference picture may involve resampling the stored reference picture to match the selected resolution. After setting the resolution for the current picture (720), the decoder decodes the current picture (740) at that resolution. If the decoding of all pictures that are to be decoded is done (750), the decoder exits. If not, the decoder continues decoding.

The decoder typically decodes pictures at the same resolutions used in the encoder. Alternatively, the decoder decodes pictures at different resolutions, such as when the resolutions available to the decoder are not exactly the same as those used in the encoder.

B. Layered Multi-Resolution Encoding and Decoding

In layered multi-resolution coding, an encoder encodes video in layers, with each layer having information for decoding the video at a different resolution. In this way, the encoder encodes at least some individual pictures in the video at more than one resolution. A decoder can then decode the video at one or more resolutions by processing different combinations of layers. For example, a first layer (sometimes referred to as a base layer) contains information for decoding video at a lower resolution, while one or more other layers (sometimes referred to as enhancement layers) contain information for decoding the video at higher resolutions.

The base layer may be designed to itself be an independently decodable bitstream. Thus, in such a design, a decoder that decodes only the base layer will produce a valid decoded bitstream at the lower resolution of the base layer. Proper decoding of higher-resolution pictures using an enhancement layer may require also decoding some or all of the encoded base layer data and possibly of one or more enhancement layers. A decoder that decodes the base layer and one or more other higher-resolution layers will be able to produce higher resolution content than a decoder that decodes only the base layer. Two, three or more layers may be used to allow for two, three or more different resolutions. Alternatively, a higher resolution layer may itself also be an independently decodable bitstream. (Such a design is often referred to as a simulcast multi-resolution encoding approach.)

Figure 8:
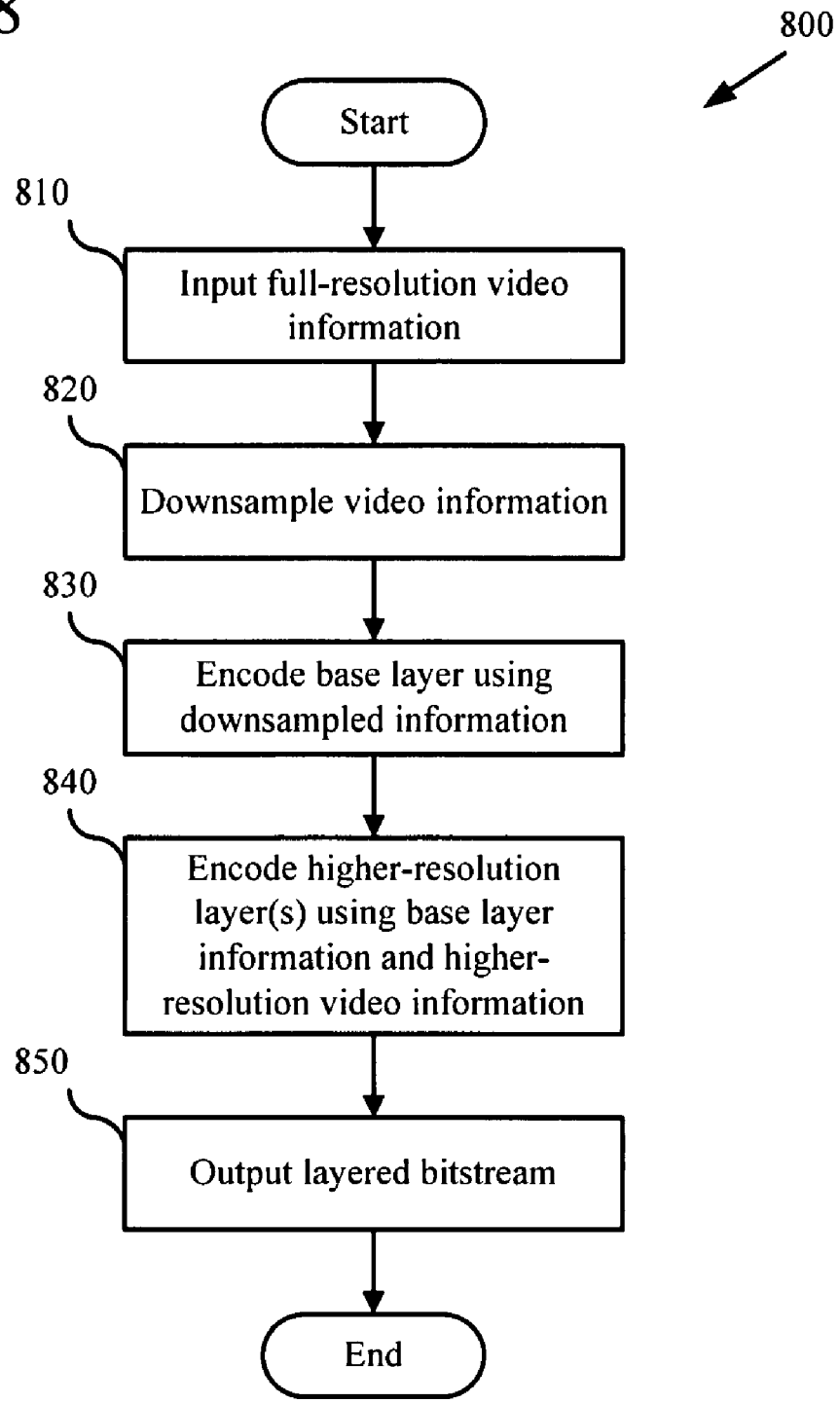
FIG. 8 is a flowchart showing a technique for encoding spatially scalable bitstream layers to allow decoding video at different resolutions.

FIG. 8 shows a technique (800) for encoding bitstream layers to allow decoding at different resolutions. An encoder such as encoder (200) in FIG. 2 takes full-resolution video information as input (810). The encoder downsamples the full-resolution video information (820) and encodes the base layer using the downsampled information (830). The encoder encodes one or more higher-resolution layers using the base layer and higher-resolution video information (840). A higher-resolution layer can be a layer that allows decoding at full resolution, or a layer that allows decoding at some intermediate resolution. The encoder then outputs a layered bitstream comprising two more of the encoded layers. Alternatively, the encoding of the higher-resolution layer (840) may not use base layer information and may thus enable the independent decoding of the higher-resolution layer data for a simulcast multi-resolution encoding approach. The encoder can signal resolution selection information and corresponding resampling filters to the decoder (for example, using one of the approaches described below for parameterization and signaling of filter information).

The encoder can accomplish multi-resolution layer encoding in several ways following the basic outline shown in FIG. 8. For more information, see, e.g., U.S. Pat. No. 6,510,177, or the MPEG-2 standard or other video standards.

Figure 9:
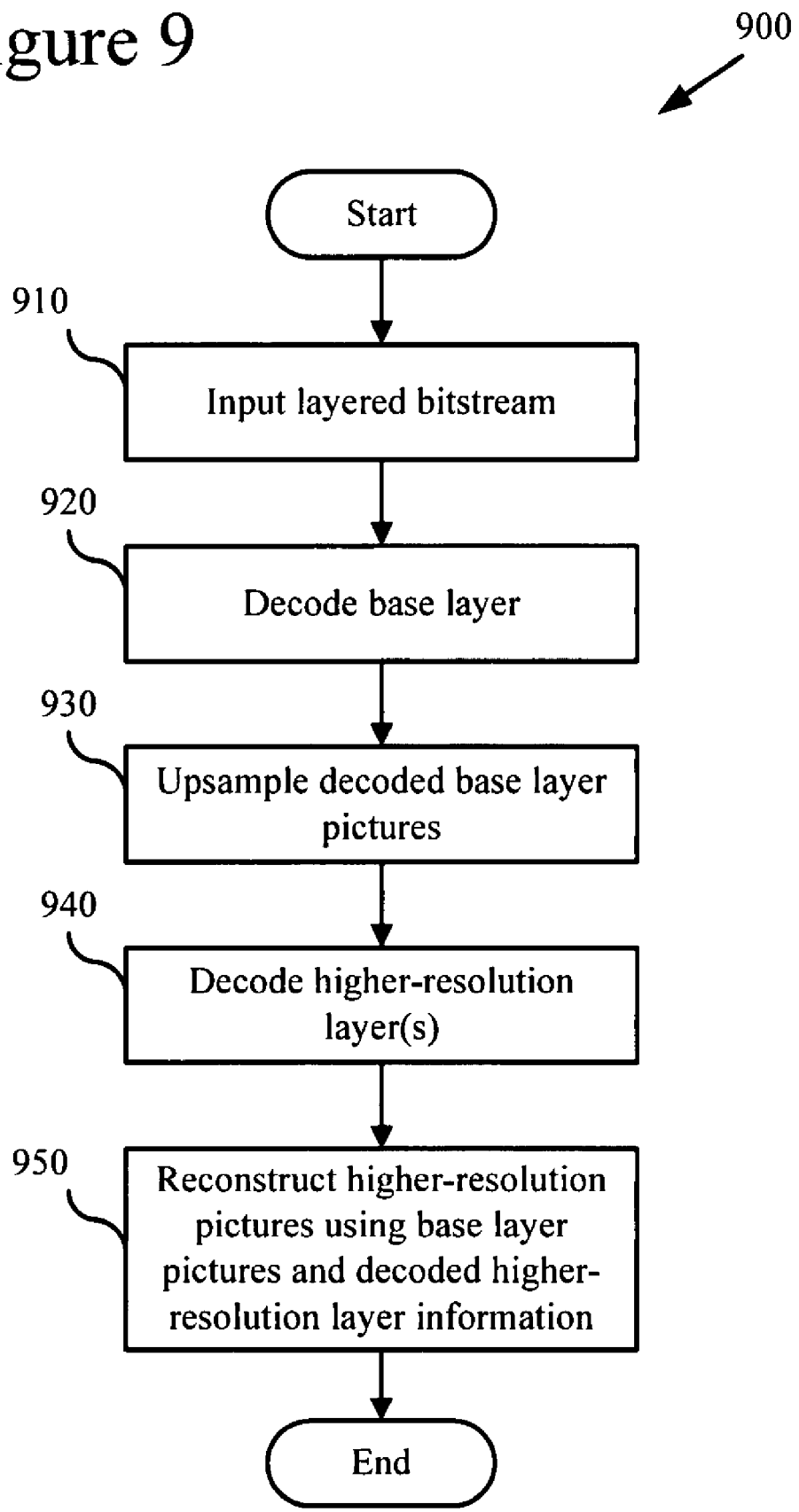
FIG. 9 is a flowchart showing a technique for decoding spatially scalable bitstream layers to allow decoding video at different resolutions.

FIG. 9 shows a technique (900) for decoding bitstream layers to allow decoding video at different resolutions. A decoder such as decoder (300) in FIG. 3 takes a layered bitstream as input (910). The layers include a lower-resolution layer (base layer) and one or more layers comprising higher-resolution information. The higher-resolution layers need not contain independently encoded pictures; typically, higher-resolution layers include residual information that describes differences between higher- and lower-resolution versions of pictures. When such information is signaled, the decoder can receive and reconstruct resolution selection information and corresponding resampling filters (for example, according one of the approaches described below for parameterization and reconstruction of filter information).

The decoder decodes the base layer (920) and, if higher-resolution decoding is desired, the decoder upsamples the decoded base layer pictures (930) to the desired resolution. The decoder decodes one or more higher-resolution layers (940) and combines the decoded higher-resolution information with the upsampled, decoded base layer pictures to form higher-resolution pictures (950). Depending on the desired resolution level, the higher-resolution pictures may be full-resolution pictures or intermediate-resolution pictures. For more information, see, e.g., U.S. Pat. No. 6,510,177, or the MPEG-2 standard or other video standards.

The decoder typically decodes pictures at one of the resolutions used in the encoder. Alternatively, the resolutions available to the decoder are not exactly the same as those used in the encoder.

IV. Parameterization and Signaling for Filters for Resampling or Interpolation

This section describes techniques and tools for parameterization and signaling of filters. The filters can be used for resampling in multi-resolution coding/decoding, layered coding/decoding, sub-sample interpolation for motion compensation or another application. Although some described techniques and tools are described in a layered (or spatial scalable) video context, some described techniques and tools can also be used in a frame-based (or reference picture sampling) context, or in some other context that involves filters (whether for encoding/decoding video or for encoding/decoding other kinds of information, such as audio information). Further, although some described techniques and tools are described in the context of resampling pictures, some described techniques and tools can also be used for resampling residual or difference signals that result from prediction of higher resolution signals. Some techniques and tools are described in a context of interpolation filters (or interpolators) but are applicable to other kinds of filtering as well. For example, some techniques and tools are applicable to filtering of known sample values in addition to interpolating between known sample positions.

Scalable video coding (SVC) is a type of digital video coding that allows a subset of a larger bitstream to be decoded to produce decoded pictures with a quality that is acceptable for some applications (although such picture quality would be lower than the quality produced by decoding an entire higher-bit-rate bitstream). One well-known type of SVC is referred to as spatial scalability, or resolution scalability. In a spatial SVC design, the encoding process (or a pre-processing function to be performed prior to the encoding process, depending on the scope of the encoding process) typically includes downsampling the video to a lower resolution and encoding that lower-resolution video for enabling a lower-resolution decoding process, and upsampling of the lower-resolution decoded pictures for use as a prediction of the values of the samples in the pictures of the higher-resolution video. The decoding process for the higher-resolution video then includes decoding the lower-resolution video (or some part of it) and using that upsampled video as a prediction of the value of the samples in the pictures of the higher-resolution video. Such designs use resampling filters. In particular, typical codec designs include the use of upsampling filters in both decoders and encoders and the use of downsampling filters in encoders or encoding pre-processors.

Typically, the upsampling process is designed to be identical in encoders and decoders, in order to prevent a phenomenon known as drift, which is an accumulation of error caused by the use of differing predictions of the same signal during encoding and decoding. A typical SVC design requires a normative upsampling filter for spatial scalability. To support arbitrary resampling ratios (a feature known as extended spatial scalability), an upsampling filter design can incorporate flexibility regarding resampling ratios.

Benefits of Multiple Interpolation Filters

For certain video coding and decoding scenarios, it is desirable to be able to switch between different interpolation filters. For example, an encoder can switch between different interpolation filters depending on their suitability for the content being encoded. Switching between interpolation filters can lead to rate-distortion improvements of 1 dB or more over codecs that use only one interpolation filter. For example, the VC-1 video codec standard allows an encoder to switch between bilinear and bicubic interpolators for motion compensation and allows the following combinations: (1) bilinear interpolation with one motion vector per macroblock and half-sample resolution; (2) bicubic interpolation with one motion vector per macroblock and half-sample resolution; (3) bicubic interpolation with one motion vector per macroblock and quarter-sample resolution; and (4) bicubic interpolation with four motion vectors per macroblock and quarter-sample resolution.

Multiple interpolation filters permit an encoder to tune frequency response to trade sharpness (or the ability to preserve frequencies, especially high-pass components) for smoothness (the ability to attenuate noise typically caused by compression artifacts in the reference frame) or vice versa. Interpolation filters can be switched at various levels in the hierarchy of a video stream (e.g., at sequence, group-of-pictures, frame, slice, macroblock or block level). Flexibility in switching at the smaller levels of the hierarchy comes at a cost of encoding overhead data for the switching information (although this may be offset to some extent with a backward-adaptive algorithm).

Another application of switching between multiple interpolation filters is in scalable video, where a video stream is sent in a resolution-layered manner. The first layer (referred to as the "base" layer) produces video at a lower spatial resolution. Enhancement layers can be used to improve color subsampling, visual quality or other metrics. More importantly, enhancement layers carry residual information which is used to improve the resolution of video. Thus, spatial resolution can be improved by combining base layers with enhancement layers. Typically, the process of generating a higher resolution video from a base layer involves upsampling the base layer reconstruction and adding the enhancement layer data. The upsampling process is implemented by a resampling filter. (Resampling filters that involve interpolation of sample values (e.g., upsampling filters) are sometimes referred to as interpolation filters or interpolators.) Multiple interpolators can be used to match an upsampling process to a source downsampling step which generated the original base layer in the first place.

Interpolation filters can be specified in different ways. For example, multiple interpolation filters can be hard-coded in an encoder and decoder. Defining filters beforehand may be beneficial to some extent, because filtering operations for known filters can be optimized or specially implemented in hardware. However, if all possible filters being used must be known beforehand, limitations appear. For example, new or improved filters may evolve over time that are more effective (e.g., due to changes in spectral content of data from improvements in sensor technologies). Furthermore, in the case of scalable video, it might not be possible to define all matching interpolators ahead of time because some encoder-side steps, such as downsampling, are not necessarily enumerated.

When using multiple interpolation filters, several problems can arise. For example, consider the following.

1. The overhead in signaling can be high (e.g., for $\frac{1}{16}$-sample resolution, four-tap filters, eight filters with three taps per filter could be specified (with the fourth tap being inferred) which is 24 independent numbers, many of which may be large; if there is an integer position, and that position is filtered, there would be nine such filters, and if no mirror-symmetry assumption about position offsets is made, there would be 15 such filters (16 if integer position is filtered)).
2. Poorly defined filters may be generated if taps are independently specified. This is particularly so when integer valued filter taps are generated by simply rounding computed floating point values for analytic interpolation filters.
3. The implementation of filters which may be arbitrarily specified presents complexity problems, both in hardware and in software.

Accordingly, families of filters are described herein that are derived from a limited set of parameters (sometimes referred to as "free parameters") that span a space of useful interpolation filters with a given support. Limiting the parameter set helps to focus on and define certain interim operations which may be optimized or implemented in hardware. The parameters may be specified to different degrees of precision. A consistent rounding rule is described that can be applied across a set of filters.

Parameterized filters described herein have several advantages, including one or more of the following.

1. The space of free parameters is much smaller than the space of unrestricted parameters. The amount of variation in information used to specify the free parameters is typically smaller than it would be for unrestricted parameters, and therefore these free parameters can be specified and signaled in a very concise manner. For instance, a high-precision, four-tap filter set for $\frac{1}{16}$-sample resolution can be specified in less than seven bytes in some implementations.
2. Filters generated by the free parameters satisfy some basic constraints on their impulse response. For example, a basic constraint is that all filters applied to a linear ramp generate values that lie on the ramp. Higher-order constraints may also be satisfied by simple extensions.
3. Further, rounding of parameters has no detrimental effect on the linear interpolation constraint. Free parameters may be chosen by rounding, integer optimization, numeric search or manually, without violating the linear interpolation constraint.
4. The implementation of an interpolator in this framework can be easily optimized in software or in hardware.

A. First Approach to Parameterizing and Signaling Interpolation Filters

In some described implementations, families of interpolation filters are constructed that can be defined by a small set of small-valued integer coefficients. Such filters may be used in image and video compression and achieve benefits in terms of improved signal quality and higher coding efficiency. In particular, such filters may be used for the upsampling of image/video data from a low-resolution sampling grid to a high resolution sampling grid. Such filters may also be used for traditional interpolation-based sub-sample motion compensation, or for filtering other kinds of information. For example, interpolation filters are also known in signal processing literature as phase-shift filters, especially when applied to audio information. Techniques and tools described herein can be applied in audio or other signal processing fields (e.g., for realizing a bitstream-specified phase shift filter).

1. Parameterized Four-Tap Filters

In some examples described herein, a set of four-tap filters that can provide a high degree of compression efficiency for scalable video is described. Described four-tap filters are competitive with six-tap filters which are over 50% more computationally complex.

Consider an N-point finite impulse response ("FIR") filter with the response $h = \{h_0, h_1 \ldots h_{N-1}\}$ represented as a row vector. The impulse response may be equivalently written in terms of N coefficients $c = \{c_0, c_1 \ldots c_{N-1}\}$, where:

$$h = c \cdot \begin{bmatrix} -1 & 1 & & & & & \\ & -1 & 1 & & & & \\ & & \ddots & \ddots & & & \\ & & & -1 & 1 & & \\ & & & & \ddots & \ddots & \\ & & & & & -1 & 1 \\ 0 & 0 & \ldots & \lambda & 1-\lambda & \ldots & 0 \end{bmatrix}.$$

The matrix M on the right-hand side is "almost" diagonal—all except one row of the matrix are shifted versions of $[-1\ 1\ 0\ \ldots]$. The last row has two nonzero entries $\lambda$ and $1-\lambda$, and the matrix is full-rank for any value of $\lambda$.

The position of the $\lambda$ and $1-\lambda$ entries is chosen to bracket the location of the sub-sample value being interpolated. Further, $\lambda$ is chosen to be $1-x$, where x is the sub-sample shift. As an example, consider a quarter-sample interpolation filter having filter taps $\{-4, 53, 18, -3\}/64$. The interpolated value is between the second and third samples in the support of the filter. Since $h = c \cdot M$, it follows that $c = h \cdot M^{-1}$. For $$h = \frac{1}{64}(-4\ \ 53\ \ 18\ \ -3)$$

and $x = \frac{1}{4}$ (and hence $\lambda = 0.75$), the relation for c is:

$$c = \frac{1}{64}(-4\ \ 53\ \ 18\ \ -3) \cdot \begin{bmatrix} -1 & 1 & 0 & 0 \\ 0 & -1 & 1 & 0 \\ 0 & 0 & -1 & 1 \\ 0 & 0.75 & 0.25 & 0 \end{bmatrix}^{-1}$$

$$= \frac{1}{64}(4\ \ -1\ \ -3\ \ 64).$$

To state the relation $h = c \cdot M$ in terms of h using simple matrix multiplication:

$h_0 = (4 \times (-1) + (-1) \times 0 + (-3) \times 0 + 64 \times 0)/64 = (-4)/64$, $h_1 = (4 \times 1 + (-1) \times (-1) + (-3) \times 0 + 64 \times 0.75)/64 = 53/64$, $h_2 = (4 \times 0 + (-1) \times 1 + (-3) \times (-1) + 64 \times 0.25)/64 = 18/64$, and $h_3 = (4 \times 0 + (-1) \times 0 + (-3) \times 1 + 64 \times 0)/64 = (-3)/64$.

Figure 10:
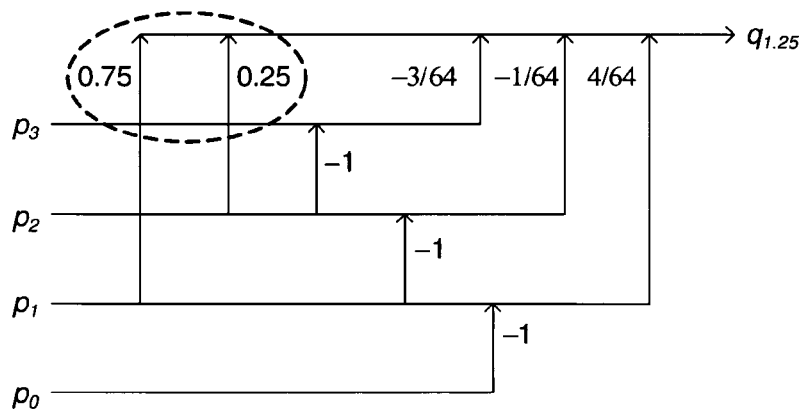
FIG. 10 is a diagram showing a representation of an interpolator as an alternate flow signal graph.

An interpolator h=c·M of this form can be depicted as an alternate signal flow graph for c·M and implemented with a corresponding filter structure. The preceding quarter-sample interpolator where $\lambda$=0.75 and $$c = \frac{1}{64}(4 \quad -1 \quad -3 \quad 64)$$

can be implemented according to the filter structure diagram in FIG. 10, where input sample values are given by $p_i$, and output by $q_i$. FIG. 10 represents the interpolator as an alternate signal flow graph. The dashed ellipse in FIG. 10 represents an operation corresponding to the last row of the matrix M, which for video is a bilinear interpolator. (The terms bilinear and bicubic can be used for both one and two dimensional operators.) The representation shown in FIG. 10 is the sum of a bilinear interpolator and other residual components. Thus, when the parameterized filter is applied to input values, the filter can be applied as the combination of c and M as shown in FIG. 10. Or, before the filter is applied, values for h can be reconstructed using c and M, with the filter taps for h applied to the inputs.

A first-order interpolator produces a value v(x) for shift x that, when the input sample values lie on a line, v(x) lies on the same line. In other words, if $p_i$=mi+l, then v(x)=mx+l. A higher-order interpolator satisfies higher-degree constraints in addition to the first-order or linear constraint. Choosing c={$c_0, c_1 \ldots c_{N-2}, 1$} produces a linear interpolator that is first order or higher if and only if $$\sum_{i=0}^{N-2} c_i = 0.$$

By choice of M, the bilinear component is given by the dot product of the last row and the vector of input sample values. Since $p_i$=mi+l and h=c·M:

$$v = c \cdot \begin{bmatrix} -1 & 1 & & & & & \\ & -1 & 1 & & & & \\ & & \ddots & \ddots & & & \\ & & & -1 & 1 & & \\ & & & & \ddots & \ddots & \\ & & & & & -1 & 1 \\ 0 & 0 & \ldots & \lambda & 1-\lambda & \ldots & 0 \end{bmatrix} \cdot \begin{bmatrix} l \\ m+l \\ \vdots \\ km+l \\ \vdots \\ (N-2)m+l \\ (N-1)m+l \end{bmatrix}$$

where the rightmost matrix indicates sample values on a line $p_i$=mi+l for i=0, 1, ..., N−1. Multiplying the two matrices, the result is a matrix with an element m in every row except the bottom row.

$$v = c \cdot \begin{bmatrix} m \\ m \\ \vdots \\ m \\ mx+l \end{bmatrix} = m\sum_{i=0}^{N-2} c_i + (mx+l)$$

Since the constraint is $$\sum_{i=0}^{N-2} c_i = 0, v = m\sum_{i=0}^{N-2} c_i + (mx+l) = mx+l.$$

These relationships can be used to design a parameterized family of interpolators. In practice, for N coefficients $c_0$, $c_1 \ldots c_{N-1}$ the values of $c_0, c_1 \ldots c_{N-2}$ are small relative to 1. These coefficients can be referred to as "intermediate coefficients." For an efficient scaled integer implementation with S bits of precision, the values are typically small integers (i.e., much smaller than the scaling factor $2^S$).

Of the N coefficients, one of the coefficients ($c_{N-1}$) has the value of 1 (after scaling) and need not be separately signaled. Further, since the remaining N−1 coefficients sum to zero, it is necessary to send only N−2 independent coefficients. Therefore, a four-sample interpolator can be fully specified using two free parameters in addition to S, which is typically chosen to be the same for the set of interpolators for each sub-sample shift within a family, or even across all families of interpolators. S can be selected based on allowable arithmetic precision on the decoder side and/or other criteria.

Higher-order behavior can be enforced with additional constraints on the coefficients $c_0, c_1 \ldots c_{N-2}$. Alternatively, the matrix M can be redefined (e.g., using shifted versions of a different kernel such as the sampled second derivative [1 −2 1] for enforcing second-order interpolation). The last row can be made to correspond to the ideal $k^{th}$-order interpolator, and suitable constraints can be chosen for the coefficients.

2. Example Parameterizations and Signaling

In this section, four interpolator families (bilinear, bicubic, Catmull-Rom and B-spline) are presented in view of the principles described above. In these examples, a four-sample support (i.e., N=4) and a sub-sample resolution of $\frac{1}{16}$-sample are used. Shifts between $\frac{1}{16}$-sample and half-sample are considered. A shift of greater than a half-sample can be realized by mirroring one of the filters for a shift between $\frac{1}{16}$-sample and $\frac{7}{16}$-sample, reversing the appropriate interpolator for (1−x). A shift of zero is considered only for the B-spline case. In these examples, S=8 is chosen for a scaling factor of 256. In other implementations, scaling involves a smaller factor, which leads to even smaller numerical values of the coefficients $c_0, c_1 \ldots c_{N-2}$.

Bilinear Interpolation

The bilinear interpolator is a case where the last row of M sufficiently defines the interpolator. This can be obtained by setting each coefficient $c_0, c_1 \ldots c_{N-2}$ to zero. As explained above, the coefficient $c_{N-1}$=1 after scaling. So, for example, if S=8, $$c = \left(\frac{1}{256}\right)[0 \quad 0 \quad 0 \quad 256].$$

Applying the relationship h=c·M, for x=$\frac{3}{16}$:

$$h = \left(\frac{1}{256}\right)[0 \quad 0 \quad 0 \quad 256] \cdot \begin{bmatrix} -1 & 1 & 0 & 0 \\ 0 & -1 & 1 & 0 \\ 0 & 0 & -1 & 1 \\ 0 & \frac{13}{16} & \frac{3}{16} & 0 \end{bmatrix}$$

$$= [0 \quad 208 \quad 48 \quad 0]\left(\frac{1}{256}\right),$$

so $$h = \begin{bmatrix} 0 & \frac{13}{16} & \frac{3}{16} & 0 \end{bmatrix}.$$

Bilinear interpolation filters for other shift positions are similarly calculated.

Bicubic Interpolation

The bicubic interpolator fits a third degree polynomial to the four data points in its support, and fractional sample values are obtained by reading off this curve. The ideal bicubic interpolator taps for this example (scaled by 256), rounded intermediate coefficients $c_0, c_1, c_2$ and effective filter taps are shown in Tables 2, 3 and 4 respectively. The ideal bicubic filter taps (Table 2) are determined using known techniques and then parameterized as rounded intermediate coefficients (Table 3) associated with rounded, integer tap values (Table 4).

TABLE 2

Bicubic interpolator coefficients for sub-sample shifts

| shift (1/16-sample units) | $h_0$ | $h_1$ | $h_2$ | $h_3$ |
|---|---|---|---|---|
| 1 | −4.84 | 247.03 | 16.47 | −2.66 |
| 2 | −8.75 | 236.25 | 33.75 | −5.25 |
| 3 | −11.78 | 223.84 | 51.66 | −7.72 |
| 4 | −14 | 210 | 70 | −10 |
| 5 | −15.47 | 194.91 | 88.59 | −12.03 |
| 6 | −16.25 | 178.75 | 107.25 | −13.75 |
| 7 | −16.41 | 161.72 | 125.78 | −15.09 |
| 8 | −16 | 144 | 144 | −16 |

Rounded intermediate coefficients c are computed according to the relation $c = h \cdot M^{-1}$ for different 1/16 sample shifts from 1/16 to 1/2.

TABLE 3

Rounded intermediate coefficients $c_0, c_1, c_2$ for bicubic interpolator

| shift (1/16-sample units) | $c_0$ | $c_1$ | $c_2$ |
|---|---|---|---|
| 1 | 5 | −2 | −3 |
| 2 | 9 | −4 | −5 |
| 3 | 12 | −4 | −8 |
| 4 | 14 | −4 | −10 |
| 5 | 15 | −3 | −12 |
| 6 | 16 | −2 | −14 |
| 7 | 16 | −1 | −15 |
| 8 | 16 | 0 | −16 |

The rounded intermediate coefficients of Table 3 parameterize rounded taps for the bicubic interpolator. For example, the rounded intermediate coefficients for $x=1/16$ indicate the rounded taps for the bicubic interpolator at the shift of 1/16.

$$h = \left(\frac{1}{256}\right) \begin{bmatrix} 5 & -2 & -3 & 256 \end{bmatrix} \cdot \begin{bmatrix} -1 & 1 & 0 & 0 \\ 0 & -1 & 1 & 0 \\ 0 & 0 & -1 & 1 \\ 0 & \frac{15}{16} & \frac{1}{16} & 0 \end{bmatrix}$$

$$= \begin{bmatrix} -5 & 247 & 17 & -3 \end{bmatrix} \left(\frac{1}{256}\right)$$

Table 4 shows the effective tap values $h=\{-5, 247, 17, -3\}$ for the 1/16-sample shift as well as effective tap values for other shifts.

TABLE 4

Effective rounded bicubic interpolator

| shift (1/16-sample units) | $h_0$ | $h_1$ | $h_2$ | $h_3$ |
|---|---|---|---|---|
| 1 | −5 | 247 | 17 | −3 |
| 2 | −9 | 237 | 33 | −5 |
| 3 | −12 | 224 | 52 | −8 |
| 4 | −14 | 210 | 70 | −10 |
| 5 | −15 | 194 | 89 | −12 |
| 6 | −16 | 178 | 108 | −14 |
| 7 | −16 | 161 | 126 | −15 |
| 8 | −16 | 144 | 144 | −16 |

Catmull-Rom Interpolation

The Catmull-Rom interpolator is a spline-based second-order interpolator with continuous derivatives across intervals. The control points of the spline are samples which are restricted to lie on the spline. The Catmull-Rom interpolator taps (scaled by 256 in this example), rounded intermediate coefficients $c_0$, $c_1$, $c_2$ and effective filter taps are shown in Tables 5, 6 and 7 respectively. The ideal Catmull-Rom interpolator filter taps (Table 5) are determined using known techniques and then parameterized as rounded intermediate coefficients (Table 6) associated with rounded, integer tap values (Table 7).

TABLE 5

Catmull-Rom interpolator coefficients for sub-sample shifts

| shift (1/16-sample units) | $h_0$ | $h_1$ | $h_2$ | $h_3$ |
|---|---|---|---|---|
| 1 | −7.03 | 253.59 | 9.91 | −0.47 |
| 2 | −12.25 | 246.75 | 23.25 | −1.75 |
| 3 | −15.84 | 236.03 | 39.47 | −3.66 |
| 4 | −18 | 222 | 58 | −6 |
| 5 | −18.91 | 205.22 | 78.28 | −8.59 |
| 6 | −18.75 | 186.25 | 99.75 | −11.25 |
| 7 | −17.72 | 165.66 | 121.84 | −13.78 |
| 8 | −16 | 144 | 144 | −16 |

Rounded intermediate coefficients c are computed according to the relation $c = h \cdot M^{-1}$ for different 1/16 sample shifts from 1/16 to 1/2.

TABLE 6

Rounded intermediate coefficients $c_0, c_1, c_2$ for Catmull-Rom interpolator

| shift (1/16-sample units) | $c_0$ | $c_1$ | $c_2$ |
|---|---|---|---|
| 1 | 7 | −7 | 0 |
| 2 | 12 | −10 | −2 |
| 3 | 16 | −12 | −4 |
| 4 | 18 | −12 | −6 |
| 5 | 19 | −10 | −9 |
| 6 | 19 | −8 | −11 |
| 7 | 18 | −4 | −14 |
| 8 | 16 | 0 | −16 |

The rounded intermediate coefficients of Table 6 parameterize rounded taps for the Catmull-Rom interpolator. Table 7 shows the effective tap values for various shifts.

TABLE 7

Effective rounded Catmull-Rom interpolator

| shift (1/16-sample units) | $h_0$ | $h_1$ | $h_2$ | $h_3$ |
|---|---|---|---|---|
| 1 | −7 | 254 | 9 | 0 |
| 2 | −12 | 246 | 24 | −2 |
| 3 | −16 | 236 | 40 | −4 |
| 4 | −18 | 222 | 58 | −6 |
| 5 | −19 | 205 | 79 | −9 |
| 6 | −19 | 187 | 99 | −11 |
| 7 | −18 | 166 | 122 | −14 |
| 8 | −16 | 144 | 144 | −16 |

B-Spline Interpolation

The B-spline interpolator fits a smooth curve capable of fitting second-degree polynomial functions with smooth derivatives across intervals. However, the sample values at integer sample locations are not enforced. Therefore, even the zero-sample-shifted value is computed for a B-spline filter from its support. The B-spline interpolator taps (scaled by 256 in this example), rounded intermediate coefficients $c_0$, $c_1$, $c_2$ and effective filter taps are shown in Tables 8, 9 and 10 respectively. Unlike Tables 2-7, Tables 8, 9 and 10 include a row for the zero-sample shift filter. The ideal B-spline interpolator filter taps (Table 8) are determined using known techniques and then parameterized as rounded intermediate coefficients (Table 9) associated with rounded, integer tap values (Table 10).

TABLE 8

B-spline interpolator coefficients for sub-sample shifts

| shift (1/16-sample units) | $h_0$ | $h_1$ | $h_2$ | $h_3$ |
|---|---|---|---|---|
| 0 | 42.67 | 170.67 | 42.67 | 0 |
| 1 | 35.16 | 169.70 | 51.14 | 0.01 |
| 2 | 28.58 | 166.92 | 60.42 | 0.08 |
| 3 | 22.89 | 162.51 | 70.32 | 0.28 |
| 4 | 18 | 156.67 | 80.67 | 0.67 |
| 5 | 13.86 | 149.57 | 91.26 | 1.30 |
| 6 | 10.42 | 141.42 | 101.92 | 2.25 |
| 7 | 7.59 | 132.39 | 112.44 | 3.57 |
| 8 | 5.33 | 122.67 | 122.67 | 5.33 |

Rounded intermediate coefficients c are computed according to the relation $c = h \cdot M^{-1}$ for different 1/16 sample shifts from 0 to 1/2.

TABLE 9

Rounded intermediate coefficients $c_0$, $c_1$, $c_2$ for B-spline interpolator

| shift (1/16-sample units) | $c_0$ | $c_1$ | $c_2$ |
|---|---|---|---|
| 0 | −43 | 43 | 0 |
| 1 | −35 | 35 | 0 |
| 2 | −29 | 29 | 0 |
| 3 | −23 | 23 | 0 |
| 4 | −18 | 17 | 1 |
| 5 | −14 | 13 | 1 |
| 6 | −10 | 8 | 2 |
| 7 | −8 | 4 | 4 |
| 8 | −5 | 0 | 5 |

The rounded intermediate coefficients of Table 9 parameterize rounded taps for the B-spline interpolator. Table 10 shows the effective tap values for various shifts.

TABLE 10

Effective rounded B-spline interpolator

| shift (1/16-sample units) | $h_0$ | $h_1$ | $h_2$ | $h_3$ |
|---|---|---|---|---|
| 0 | 43 | 170 | 43 | 0 |
| 1 | 35 | 170 | 51 | 0 |
| 2 | 29 | 166 | 61 | 0 |
| 3 | 23 | 162 | 71 | 0 |
| 4 | 18 | 157 | 80 | 1 |
| 5 | 14 | 149 | 92 | 1 |
| 6 | 10 | 142 | 102 | 2 |
| 7 | 8 | 132 | 112 | 4 |
| 8 | 5 | 123 | 123 | 5 |

The rounded intermediate coefficients $c_0$, $c_1$ ... $c_{N-2}$ show a smooth pattern of evolution for each family of filters in the examples, going from 1/16-sample (0 sample for the B-spline case) to the half-sample position. This trend is often monotonic, but not necessarily monotonic, as can be seen from the Catmull-Rom coefficients in Table 6. The smoothness of the evolution can be used to represent the rounded intermediate coefficients in an efficient manner by differentially coding the coefficients $c_i$ for the same i from filter to filter within a family, as explained below.

Further, the rounded intermediate coefficients of four-tap filters have some other properties that can be used to make signaling more efficient. For example, for the smallest sample shift in the examples (1/16-sample), the corresponding value of $c_2$ is typically small. So, it can be signaled as the first of the $c_2$ coefficients to save bits in some implementations. This is because the rightmost sample has the least influence on the interpolated value, given that it is the farthest away. Likewise, when symmetry is considered, $c_1 = 0$ for the half-sample interpolator. Since $c_0 = -c_1 - c_2$, it need not be specified in the bitstream.

One or more of the preceding filter families can be used, depending on implementation. Alternatively, other and/or additional filter families are parameterized and used, for example, for different types of curves.

3. Encoding/Signaling Coefficients and Other Filter Information

In view of the observations above, in some implementations, a family of four-tap filters can be defined and signaled as follows:

1. Specify the sub-sample resolution r in log form minus 1 ($1/2^{r+1}$, so 0 represents half-sample resolution, 3 represents 1/16-sample resolution, etc). This can be signaled, for example, with a fixed-length code ("FLC").
2. Specify scaling bits S for the scale factor $2^S$, which can be signaled, for example, with an FLC.
3. Specify whether full-sample "interpolation" is filtered or not (e.g., with a Boolean flag). Alternatively, this can be signaled together with the scaling bits using a variable length code.
4. Starting with the position just prior to the half-sample position for $c_1$, specify the $c_1$ values from shift position to shift position using a second degree differential code (2DDC) as described below, in decreasing order of sub-sample shift. (The half-sample position for $c_1$ is zero, and no value for it is signaled.)
5. Starting with the smallest sub-sample shift for $c_2$ (which may be, for example, 1/16-sample shift or zero), specify $c_2$ values from shift position to shift position in increasing order of sub-sample shift using 2DDC. Note that in this approach the number of coded $c_2$ coefficients is one more than the number of coded $c_1$ coefficients since $c_1$ is not signaled for the half-sample position.

6. Repeat steps 1 through 6 for each filter family in succession. Alternatively, if each filter family has the same resolution r and scaling bits S parameters, steps 3 through 6 are repeated for each subsequent filter family in succession.

As an example, consider a Catmull-Rom interpolator with sub-sample resolution=3 ($\frac{1}{16}$-sample), full-sample "interpolation"=false, S=8, and four coefficients. Table 6 shows the rounded intermediate coefficient parameters for this interpolator. Rounded intermediate coefficient parameters are signaled for $c_1$ and $c_2$ in the family, for the parameters shown in Table 6.

Figure 11A:
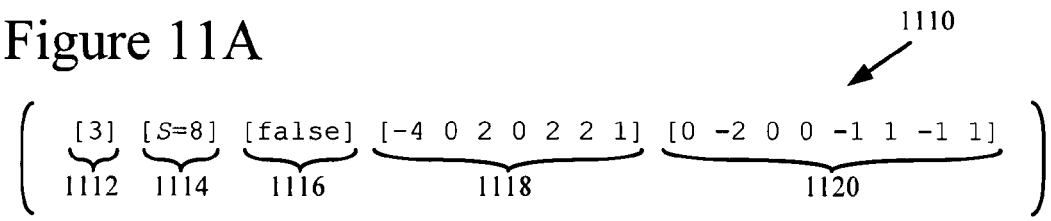
FIG. 11A is a symbolic representation of a family of Catmull-Rom interpolation filters with rounded intermediate coefficient parameters.

FIG. 11A shows a symbolic representation (1110) of this family of filters—a full specification of a Catmull-Rom interpolator with $\frac{1}{16}$-sample resolution using second degree differential coding for rounded intermediate coefficient parameters $c_1$ and $c_2$. The resolution is $\frac{1}{2^{3+1}}=\frac{1}{16}$ (represented by the symbol "3" (1112)) and the scale factor is $2^S=256$ (represented by the symbol "S=8" (1114)). The "false" symbol (1116) represents a parameter that indicates no integer position filter information is signaled. The rounded intermediate coefficient parameters $c_1$ and $c_2$, differentially coded, are shown as strings of integers (1118, 1120, respectively) in FIG. 11A. The first string of integers (1118) includes only seven integers (the integer $x_0$ is known to be zero and need not be encoded).

The rounded intermediate coefficient parameters can be differentially encoded, which tends to result in lower values given the overall trends of $c_1$ and $c_2$ to smoothly change in value from shift position to shift position. In practice, the rounded intermediate coefficient parameters, whether differentially coded or not, are signaled as fixed-length codes or variable-length codes.

Second Degree Differential Coding (2DDC)

A second-degree differential code described here can be used to encode a sequence of integers $x_0, x_1 \ldots x_k$ as follows:
1. Integer $x_0$ is encoded using an FLC or a variable-length code ("VLC"). (Or, for some filter coefficient parameters, $x_0$ is implied (e.g., to be zero) and not signaled.)
2. Difference $d_1=x_1-x_0$ is encoded using an FLC or a VLC.
3. For j=2 through k, $d_j=x_j-2x_{j-1}+x_{j-2}$ is encoded in order using an FLC or a VLC.

The decoding steps can be derived from the encoding steps.
1. Integer $x_0$ is decoded (or otherwise determined if implied).
2. Difference $d_1$ is decoded and added to $x_0$ to determine $x_1$. $x_1=x_0+d_1$.
3. For j=2 through k, $d_j$ is decoded and added to $2x_{j-1}-x_{j-2}$.

$x_j=2x_{j-1}-x_{j-2}+d_j$.

Thus, in FIG. 11A, the $c_1$ series 0, −4, −8, −10, −12, −12, −10, −7 is represented in the first string of integers (1118) as:

$d_1=(-4)-0=-4$, $d_2=(-8)-(2\times(-4))+0=0$, $d_3=(-10)-(2\times(-8))+(-4)=2$, $d_4=(-12)-(2\times(-10))+(-8)=0$, $d_5=(-12)-(2\times(-12))+(-10)=2$, $d_6=(-10)-(2\times(-12))+(-12)=2$, and $d_7=(-7)-(2\times(-10))+(-12)=1$.

As this series shows, even though the amplitudes of the rounded intermediate coefficients c are already small relative to the scale factor, differential coding further reduces the amplitudes, which can set up efficient entropy coding.

The codes described in the 2DDC encoding steps may depend on S. Alternatively, the 2DDC encoding steps can be different than those described above. Or, the encoder uses first-degree differential coding, where $d_n=x_n-x_{n-1}$. The base value and differential values can be coded as FLC (see below), VLC using Golomb codes (see below) or other variant of VLC. Or, the integers and differences can be encoded using arithmetic coding.

Fixed-Length Coding of 2DDC

Example encoding steps for a fixed length coding of 2DDC are listed below:
1. Encode word size N using a fixed length of k bits. For example, k=2 can be used, but other values of k also can be used (e.g., depending on the value of S and the sub-sample resolution).
2. Encode abs($x_0$) with N+3 bits. If $x_0$ is nonzero, signal sign of $x_0$ with 1 bit. (Or, for some filter coefficient parameters, $x_0$ is implied (e.g., to be zero) and not signaled.)
3. Encode abs($d_1$) with N+2 bits. If $d_1$ is nonzero, signal sign of $d_1$ with 1 bit.
4. For j>1, encode abs($d_j$) with N+1 bits. If $d_j$ is nonzero, signal sign of $d_j$ with 1 bit.

Example decoding steps for a fixed length coding of 2DDC are listed below:
1. Receive code representing word size N using a fixed length of k bits and decode it.
2. Receive code representing $x_0$ with N+3 bits and decode it (or otherwise determine $x_0$ if it is implied and not signaled). If $x_0$ is nonzero, process the 1-bit sign of $x_0$ and set $x_0=-x_0$ if this bit is 1.
3. Receive code representing $d_1$ with N+2 bits and decode it. If $d_1$ is nonzero, process the 1-bit sign of $d_1$ and set $d_1=-d_1$ if this bit is 1. Set $x_1=x_0+d_1$.
4. For j>1, receive code(s) representing $d_j$ with N+1 bits and decode them. If $d_j$ is nonzero, process the 1-bit sign of $d_j$ and set $d_j=-d_j$ if this bit is 1. Set $x_j=2x_{j-1}-x_{j-2}+d_j$.

Alternatively, the encoder and decoder use a different fixed length encoding/decoding scheme.

Variable-Length Coding of 2DDC

Instead of using FLCs, 2DDC coding can use variable length coding. For example, the following encoding steps can be used.
1. Encode $x_0$ with a signed integer, exponential Golomb ("Exp-Golomb") code. (Or, for some filter coefficient parameters, $x_0$ is implied (e.g., to be zero) and not signaled.)
2. For j>0, encode $d_j$ with a signed integer Exp-Golomb code.

For 2DDC coding that uses Exp-Golomb codes, the following decoding steps can be used.
1. Receive a signed integer Exp-Golomb code representing $x_0$ and decode it (or otherwise determine $x_0$ if it is implied and not signaled).
2. Receive a signed integer Exp-Golomb code representing $d_1$ and decode it. Set $x_1=x_0+d_1$.
3. Receive signed integer Exp-Golomb code(s) representing $d_j$ for j>1 and decode them. Set $x_j=2x_{j-1}-x_{j-2}+d_j$.

With signed integer Exp-Golomb coding, integer values can be represented as shown in Table 11, below.

TABLE 11

Example Exp-Golomb codes values for integer values

| Bit string | Integer value |
| --- | --- |
| 1 | 0 |
| 010 | 1 |
| 011 | −1 |
| 00100 | 2 |
| 00101 | −2 |
| 00110 | 3 |
| 00111 | −3 |
| 0001000 | 4 |
| 0001001 | −4 |

Alternatively, the encoder and decoder use another variant of signed Exp-Golomb or Golomb codes for VLCs, or the encoder and decoder use another variant of entropy coding for the signaled coefficient parameter values.

Figure 11B:
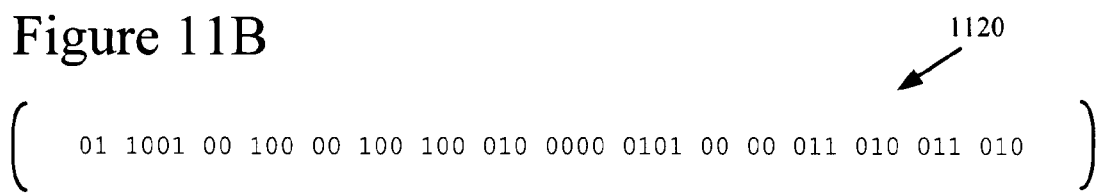
FIGS. 11B and 11C are fixed-length code and variable length code representations, respectively, for the symbolic representation of FIG. 11A.
Figure 11C:
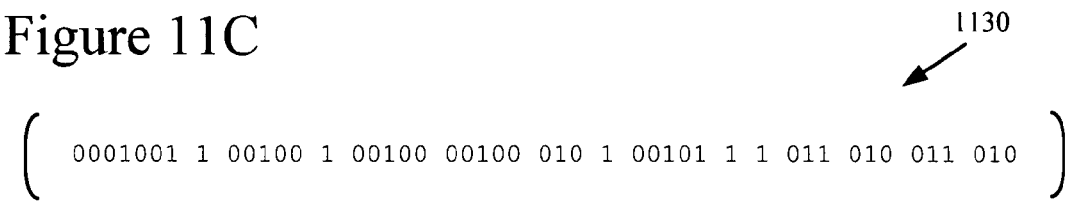

FIGS. 11B and 11C show representations of the Catmull-Rom interpolator's rounded intermediate coefficient parameters of FIG. 11A.

FIG. 11B shows an example FLC representation (1120) with 46 bits. In FIG. 11B, the word size (N=1) is signaled with two bits (01). Recall that $x_0=0$. In FIG. 11B, the value of $x_0$ is implied, and therefore $x_0$ is not coded. Recall that $d_1=-4$. The absolute value of $d_1$ is coded with N+2, or three bits, and since $d_1$ is non-zero, the sign is coded using one more bit, resulting in a four-bit code (1001). Recall that $d_2=0$. The absolute value of $d_2$ is coded with N+1, or two bits, and since $d_1$ is zero, no sign bit is necessary, resulting in a two-bit code (00).

Alternatively, an encoder and decoder use a different FLC approach.

FIG. 11C shows an example VLC representation (1130) with 47 bits. In FIG. 11C, Exp-Golomb codes from Table 11 are used. Alternatively, an encoder and decoder use a different VLC approach.

Alternatively, filters can be specified and signaled in some other way. For example, filter parameters can be encoded with more or fewer bits, or the parameters can be encoded using an encoding scheme other than 2DDC, such as first-degree differential coding. For entropy coding, whether or not differential coding is used, approaches such as arithmetic coding or Huffman coding can be used instead of signed exp-Golomb coding. Other alternative signaling techniques include signaling sub-sample precision and scaling factors in different ways and/or jointly with other information.

4. Advantages

The filter parameterizations described above have several potential advantages.

Rounding Behavior

One advantage of the above examples involves rounding behavior. The first-order interpolation constraint is satisfied without strict adherence to ordinary rounding rules.

Consider a 1/16-sample Catmull-Rom interpolator with ideal filter taps {−7.0312, 253.5936, 9.9064, −0.4688} which has been rounded to {−7, 254, 10, 0} following ordinary rounding rules. This filter is problematic because it does not sum to 256, which is the scaling factor. Therefore, for example, a straight DC input of {129, 129, 129, 129} runs the risk of being rounded up to 130, which can cause undesirable visual artifacts.

If the filter is adjusted to a slightly different value by rounding the last coefficient down to −1 (resulting in rounded values of {−7, 254, 10, −1}), the rounded values sum to 256, but a discrepancy between expected and actual output values occurs for some inputs. If the input is {a, b, c, d}, the output of the (rounded) interpolation filter is computed as follows:

$$(a*(-7)+b*254+c*10+d*(-1)+128)>>8.$$

Therefore, for example, if the input is {216, 72, −72, −216}, the output of the (rounded) interpolation filter is computed as follows:

$$(216*(-7)+72*254+(-72)*10+(-216)*(-1)+128)>>8=64.$$

However, with an input of {216, 72, −72, −216} the expected output for 1/16-sample interpolation, which is obtained if the ideal, unrounded filter taps are used, is 63 (not 64). The difference in output is due to the fact that the rounding technique did not preserve linearity. Such discrepancies, although minor, can significantly affect the overall rate-distortion performance of a video codec.

On the other hand, an effective 1/16-sample Catmull-Rom interpolator constructed as in the example given above has a response {−7, 254, 9, 0}, which leads to a slightly larger rounding error from the "ideal" behavior in its third coefficient (0.9064 instead of 0.0936). However, the output of the interpolation filter will be 63 (as expected):

$$(216*(-7)+72*254+(-72)*9+(-216)*(0)+128)>>8=63.$$

Moreover, the filter taps sum to 256. This rounding behavior for filter tap values preserves linearity exactly for all linear inputs.

Complexity

Another advantage is reduced complexity. In general, for the example filters shown above, a four-point filter can be realized with four multiplication operations and some additions. In the construction above, two multiplication operations are used in the generation of the bilinear interpolator (e.g., the bilinear interpolator part λ and 1−λ in the examples). Further, for some of the example filters for bicubic, Catmull-Rom and B-spline interpolation, only two other multiplications are required to produce all coefficients. This can be done by forming a gradient block and multiples with $c_0$ and $c_1$ alone. Recall that the sum of $c_0$, $c_1$ and $c_2$ is zero. The multiple with $c_2$ is merely the negative of the sum of multiples with $c_0$ and $c_1$. Therefore, the number of multiplication operations is still four in example filters implemented as c·M.

Further, the coefficients $c_0, c_1, c_2$ are typically small relative to the scaling factor. It is often possible to efficiently enumerate these multiplication operations in hardware or software as shifts and adds rather than using multiplication operations for them. The bilinear filter is itself a common denominator for all the filter families (considering the λ and 1−λ part of the bottom row of the matrix M) and can be optimized separately. There is an increase in the number of additions from three to six but this can be offset by exploiting one or more other properties mentioned here. Similar observations apply to interpolators with larger support.

New Filters

Another advantage is an improved ability to use new and/or improved filters. New interpolation filters can be generated by searching through a set of free intermediate coefficients, typically subject to some overall metric such as flat frequency response. Since all the filters thus produced are first order or higher, sub-sample shift is honored.

B. Additional Examples of Effective 1/16-Sample Filters for Scalable Video Coding with a Different Scale Factor The following tables describe example families of four-tap filters with a scale factor of 32 (i.e., S=5) that can be used in scalable video coding or other applications. For example, Table 12 describes a four-tap, 1/16-sample resolution, Catmull-Rom derived interpolation filter, Table 13 describes a four-tap 1/16-sample resolution, B-spline derived interpolation filter, and Table 14 describes a four-tap 1/16-sample resolution, bicubic interpolation filter. The "SS4" class of interpolator families, including the basic SS4 filter family described in Table 15 and the SS4-smooth filter family described in Table 16 are designed to produce smooth interpolations.

These filters can be parameterized as filter coefficient parameters $c_0$, $c_1$ and $c_2$ and signaled using 2DDC with FLCs of VLCs, as described above. Or, they can be parameterized and/or signaled using another mechanism. The filters can be implemented as a combination of c and M to provide the effective performance of filters with the taps shown in Tables 12-15, or filters having these taps can be reconstructed before filtering.

TABLE 12

Four-tap, 1/16-sample resolution Catmull-Rom derived interpolation filter

| Shift (fractional-sample units) | Effective Filter Taps | | | |
|---|---|---|---|---|
| | $h_0$ | $h_1$ | $h_2$ | $h_3$ |
| 0/16 | 0 | 32 | 0 | 0 |
| 1/16 | −1 | 32 | 1 | 0 |
| 2/16 | −1 | 30 | 3 | 0 |
| 3/16 | −2 | 29 | 6 | −1 |
| 4/16 | −2 | 27 | 8 | −1 |
| 5/16 | −2 | 25 | 10 | −1 |
| 6/16 | −2 | 23 | 12 | −1 |
| 7/16 | −2 | 20 | 16 | −2 |
| 8/16 | −2 | 18 | 18 | −2 |
| 9/16 | −2 | 16 | 20 | −2 |
| 10/16 | −1 | 12 | 23 | −2 |
| 11/16 | −1 | 10 | 25 | −2 |
| 12/16 | −1 | 8 | 27 | −2 |
| 13/16 | −1 | 6 | 29 | −2 |
| 14/16 | 0 | 3 | 30 | −1 |
| 15/16 | 0 | 1 | 32 | −1 |

TABLE 13

Four-tap, 1/16-sample resolution B-spline derived interpolation filter

| Shift (fractional-sample units) | Effective Filter Taps | | | |
|---|---|---|---|---|
| | $h_0$ | $h_1$ | $h_2$ | $h_3$ |
| 0/16 | 5 | 22 | 5 | 0 |
| 1/16 | 4 | 22 | 6 | 0 |
| 2/16 | 4 | 20 | 8 | 0 |
| 3/16 | 3 | 20 | 9 | 0 |
| 4/16 | 2 | 20 | 10 | 0 |
| 5/16 | 2 | 18 | 12 | 0 |
| 6/16 | 1 | 18 | 13 | 0 |
| 7/16 | 1 | 16 | 15 | 0 |
| 8/16 | 1 | 15 | 15 | 1 |
| 9/16 | 0 | 15 | 16 | 1 |
| 10/16 | 0 | 13 | 18 | 1 |
| 11/16 | 0 | 12 | 18 | 2 |
| 12/16 | 0 | 10 | 20 | 2 |
| 13/16 | 0 | 9 | 20 | 3 |
| 14/16 | 0 | 8 | 20 | 4 |
| 15/16 | 0 | 6 | 22 | 4 |

TABLE 14

Four-tap, 1/16-sample resolution bicubic interpolation filter

| Shift (fractional-sample units) | Effective Filter Taps | | | |
|---|---|---|---|---|
| | $h_0$ | $h_1$ | $h_2$ | $h_3$ |
| 0/16 | 0 | 32 | 0 | 0 |
| 1/16 | −1 | 32 | 1 | 0 |
| 2/16 | −1 | 29 | 5 | −1 |
| 3/16 | −1 | 27 | 7 | −1 |
| 4/16 | −2 | 27 | 8 | −1 |
| 5/16 | −2 | 24 | 12 | −2 |
| 6/16 | −2 | 22 | 14 | −2 |
| 7/16 | −2 | 20 | 16 | −2 |
| 8/16 | −2 | 18 | 18 | −2 |
| 9/16 | −2 | 16 | 20 | −2 |
| 10/16 | −2 | 14 | 22 | −2 |
| 11/16 | −2 | 12 | 24 | −2 |
| 12/16 | −1 | 8 | 27 | −2 |
| 13/16 | −1 | 7 | 27 | −1 |
| 14/16 | −1 | 5 | 29 | −1 |
| 15/16 | 0 | 1 | 32 | −1 |

TABLE 15

Four-tap, 1/16-sample resolution "SS4" interpolation filter

| Shift (fractional-sample units) | Effective Filter Taps | | | |
|---|---|---|---|---|
| | $h_0$ | $h_1$ | $h_2$ | $h_3$ |
| 0/16 | 0 | 32 | 0 | 0 |
| 1/16 | −1 | 32 | 1 | 0 |
| 2/16 | −2 | 31 | 4 | −1 |
| 3/16 | −2 | 29 | 6 | −1 |
| 4/16 | −3 | 28 | 9 | −2 |
| 5/16 | −3 | 26 | 11 | −2 |
| 6/16 | −3 | 24 | 13 | −2 |
| 7/16 | −3 | 21 | 17 | −3 |
| 8/16 | −3 | 19 | 19 | −3 |
| 9/16 | −3 | 17 | 21 | −3 |
| 10/16 | −2 | 13 | 24 | −3 |
| 11/16 | −2 | 11 | 26 | −3 |
| 12/16 | −2 | 9 | 28 | −3 |
| 13/16 | −1 | 6 | 29 | −2 |
| 14/16 | −1 | 4 | 31 | −2 |
| 15/16 | 0 | 1 | 32 | −1 |

TABLE 16

Four-tap, 1/16-sample resolution "SS4-smooth" interpolation filter

| Shift (fractional-sample units) | Effective Filter Taps | | | |
|---|---|---|---|---|
| | $h_0$ | $h_1$ | $h_2$ | $h_3$ |
| 0/16 | 0 | 32 | 0 | 0 |
| 1/16 | −1 | 32 | 1 | 0 |
| 2/16 | −2 | 32 | 2 | 0 |
| 3/16 | −3 | 31 | 5 | −1 |
| 4/16 | −3 | 29 | 7 | −1 |
| 5/16 | −3 | 26 | 11 | −2 |
| 6/16 | −3 | 24 | 13 | −2 |
| 7/16 | −3 | 21 | 17 | −3 |
| 8/16 | −3 | 19 | 19 | −3 |
| 9/16 | −3 | 17 | 21 | −3 |
| 10/16 | −2 | 13 | 24 | −3 |
| 11/16 | −2 | 11 | 26 | −3 |
| 12/16 | −1 | 7 | 29 | −3 |
| 13/16 | −1 | 5 | 31 | −3 |
| 14/16 | 0 | 2 | 32 | −2 |
| 15/16 | 0 | 1 | 32 | −1 |

Weighted means of filters also can be used. For example, weighting can be carried out in floating point, after which free parameters can be rounded. As another example, weighting can be carried out on integer-generated filter taps, followed by rounding.

C. Second Approach to Parameterizing and Signaling Interpolation Filters

This section describes another approach to parameterizing and signaling interpolation filters for resampling in scalable video coding, sub-sample interpolation in motion compensation, or another application.

In general, texture signals of base layer pictures can be upsampled using different kinds of filters, with different numbers of filter taps. For example, one design uses a set of pre-fixed six-tap filters before the base layer pictures are applied as predictions for the enhancement layer pictures. Six-tap filters tend to result in higher computational complexity than four-tap filters. Therefore, it may be desirable in some scenarios to shorten upsampling filters to four taps in order to reduce computational complexity.

Furthermore, depending on the downsampling process, there could be some benefit to allowing encoders to choose filter details rather than to force the use of one specific filter all the time. Therefore, it can be desirable to have corresponding flexibility in upsampling filter selections for various video contents and applications. Also, it can be desirable to have the phase of the upsampling filter coefficients at the fractional sample locations satisfy linearity constraints (i.e., constant group delay).

Accordingly, a framework for filter selection (e.g., for luma texture upsampling) is described. In examples described herein, the framework is based on a family of four-tap filters. The filters are parameterized to allow a high degree of freedom while keeping syntax overhead very low. Examples described herein allow flexibility in filter selection for various downsampling options. The described parameterization can be used on many different filters to parameterize or closely approximate the different filters. The four-tap families exhibit some moderate degradation when compared with a six-tap filter design in some situations, but achieve other benefits such as reduced computational complexity and signaling efficiency. Coding performance is demonstrated using three different example filters.

In some implementations, a parameterized family of four-tap filters has an average of one small-valued integer parameter signaled per filter phase, and the following design principles are taken into consideration.

- The filters have a four-tap impulse response for low computational complexity in operation.
- The control parameters are designed to be small and integer-valued for efficient specification at an appropriate header level.
- Mirror symmetry is enforced so that for specification of P fractional phases, the filter for phase P−j is a mirror image of the filter for phase j, thus cutting the number of free parameters that need to be specified in half (from 4*P to 2*P).
- For input samples that fall on a straight line, the filter output is constrained to reproduce the straight line. This adds magnitude and slope constraints that further cut the number of free parameters in half again (from 2*P to P).

Such design principles can be modified for different implementations. Alternatively, other types of filters (e.g., six-tap filters or other four-tap filter designs) can be used, following the preceding design principles as constraints in the design phase for the filters.

1. Application of Filter Design Concepts for Parameterization in Second Approach Consider the following task: interpolate the value of a sample at a fractional position x between samples $y_0$ and $y_1$ in a string of samples, where sample $y_0$ is conceptually at position x=0 and sample $y_1$ is conceptually at position x=1. To perform this task, a finite impulse response ("FIR") filter of length N can be applied, such that the output y is given by $$z = \sum_{i=-N/2+1}^{N/2} y_i * h_i.$$

Figure 12:
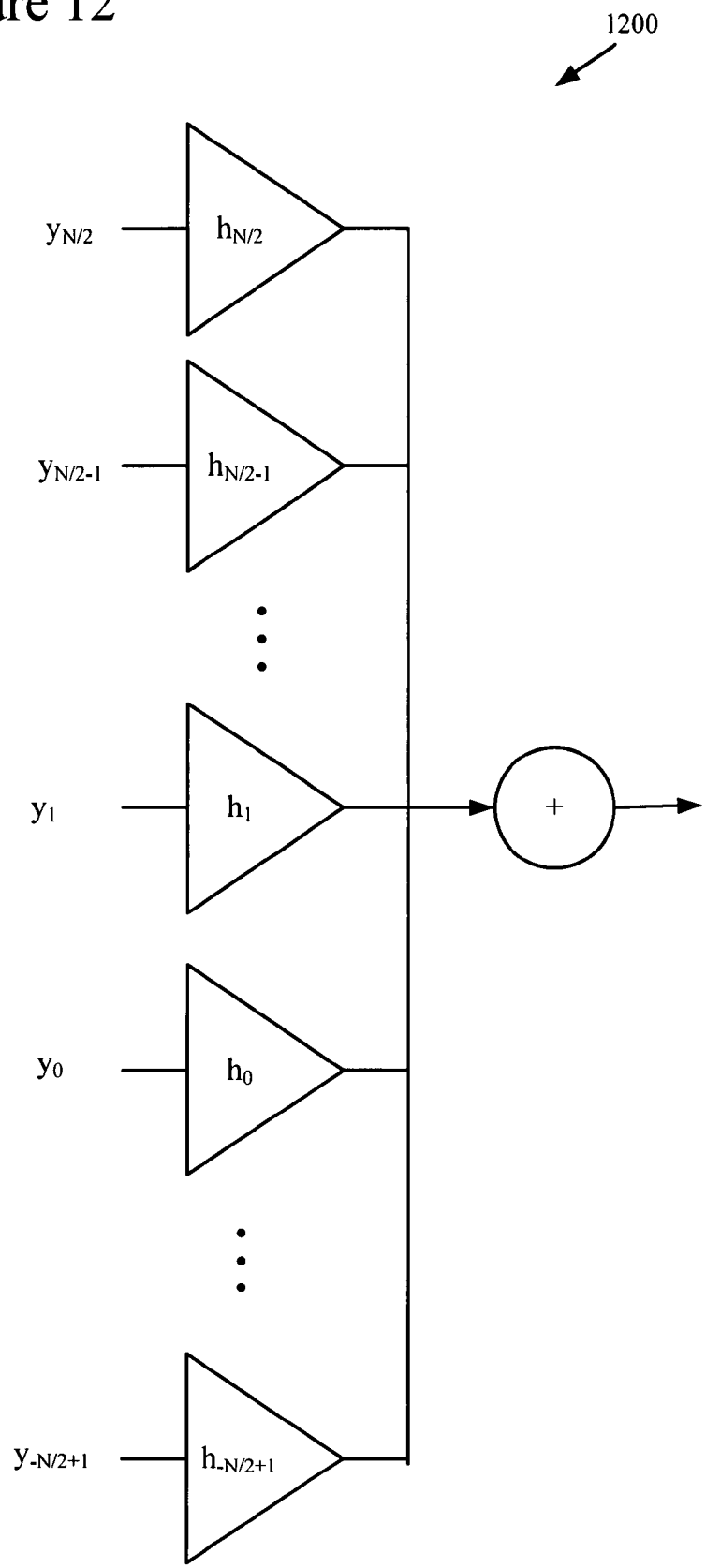
FIG. 12 is a diagram of a finite impulse response filter for interpolating sample values at fractional-sample positions.

This situation is depicted in the filter (1200) shown in FIG. 12, which shows samples $y_{N/2}$ to $y_{-N/2+1}$ and tap values $h_{N/2}$ to $h_{-N/2+1}$.

Figure 13:
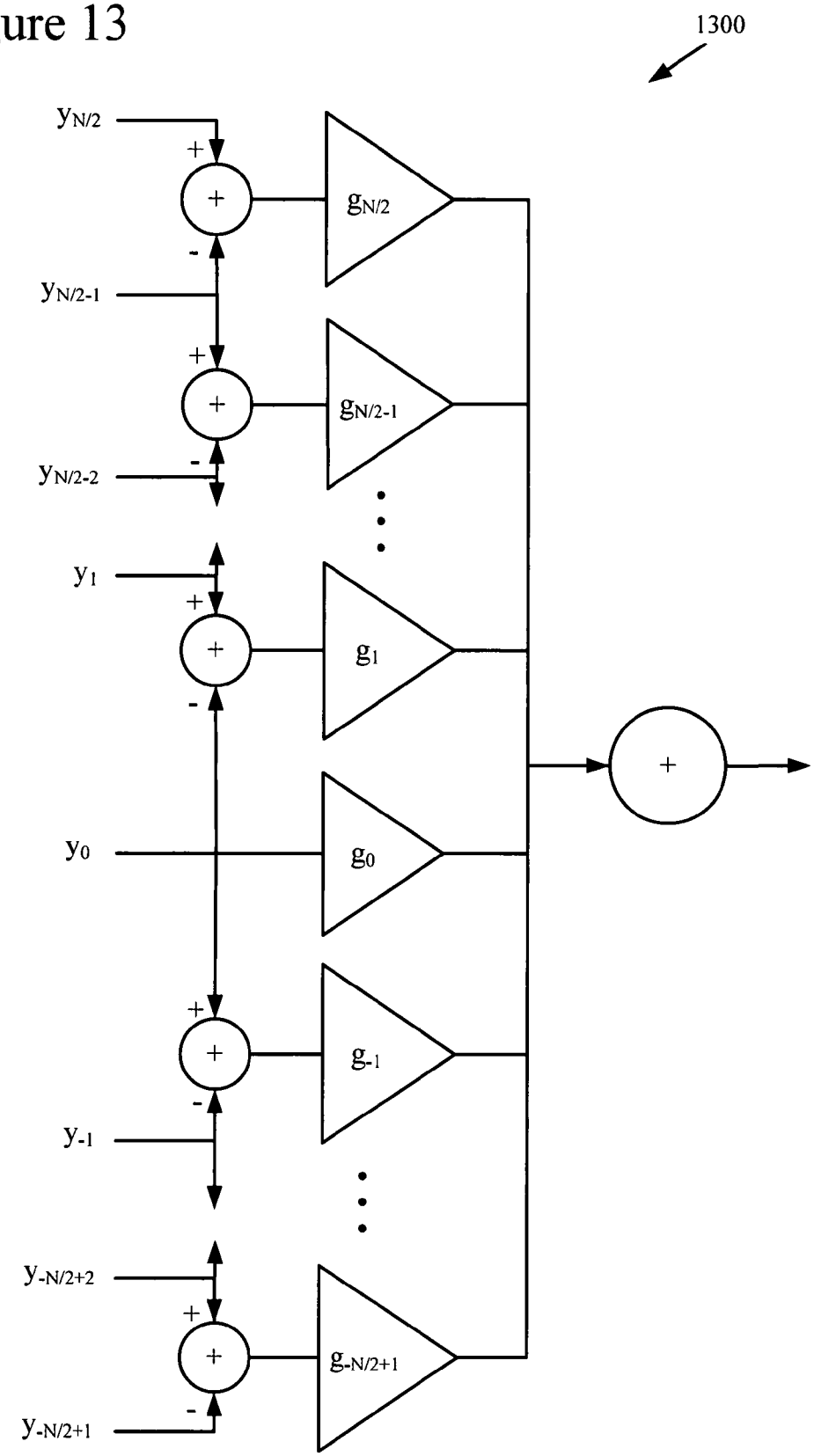
FIG. 13 is a diagram of a parameterized finite impulse response filter for interpolating sample values at fractional-sample positions.

This problem can be equivalently conceptually restructured in the form shown in FIG. 13, using a set of parameters $g_i$ rather than directly using the tap values $h_i$. In the filter (1300) shown in FIG. 13, the $g_0$ parameter is applied directly to the $y_0$ input value, and all other $g_i$ parameters are applied to the difference between a consecutive pair of samples.

Referring again to the alternative form shown in FIG. 13, consider a case where all input values are equal to the same constant b. In this case, the input to every $g_i$ multiplier other than $g_0$ will be zero, since all of the computed differences between pairs of samples will be zero. Thus, $g_0$ should be chosen to be equal to 1 so that the value of the output z will be equal to b.

Next, consider a case where all input values lie on a straight line, i.e., $y_i$=m*i+b. In this case, the input to every $g_i$ multiplier other than $g_0$ will be m, since the difference between pairs of consecutive samples is (m*(i+1)+b)−(m*i+b)=m. In this situation, it is desirable for the output value z to fall on the same straight line, i.e., that z=m*x+b. This results in the constraint $$\sum_{i \neq 0} g_i = x.$$

The primary contribution to the output is from the neighboring samples $y_0$ and $y_1$, and thus the primary non-zero multipliers are $g_0$ and $g_1$. (In a bilinear filter, these are the only contributors to the output value.) Thus, the value of $g_1$ is approximately equal to x so that $$\sum_{i \neq 0} g_i = x$$

will be approximately filled by $g_0$ and $g_1$ alone. It is therefore reasonable to represent the actual value of $g_1$ as a difference from a default value x. This "default" and the constraints lead to the ability to represent an N-tap FIR interpolation filter using N−2 parameters that will all be relatively small (and thus take very few bits to encode).

2. Parameterized Filter Designs

In some implementations, a parameterized four-tap filter h(x) for a sub-sample shifted location x is defined as:

$$h(x)=[h_0\, h_1\, h_2\, h_3],$$

where the filter taps $h_i$ are functions of a sub-sample shifted location x and shift-dependent integer parameters a and b, as follows:

$$h_0 = a+b$$

$$h_1 = (1-x)2^S - (2a+b)$$

$$h_2 = x2^S + a - b$$

$$h_3 = b$$

where S is the scaling of the filter in bits of precision. This family of filters satisfies a constraint of first order interpolation. Higher order interpolation constraints may be imposed on this filter by appropriate choice of a and b.

Next, consider an input signal y(n)=sn+t, which is a linear ramp. For n=0, the interpolated value at sub-sample shifted location x (considering positions n=−1, 0, 1 and 2) is:

$$y(x) = \frac{(-s+t)(a+b) + t((1-x)2^S - (2a+b)) + (s+t)(x2^S + a - b) + (2s+t)b}{2^S}$$

$$= \frac{2^S(sx+t)}{2^S}$$

$$= sx + t.$$

The interpolated value lies on the linear ramp for all values of sub-sample shift x.

For the first order interpolation constraint, there are no limitations on the values of a and b—the first order interpolation constraint is satisfied for all a and b. Further, this constraint is satisfied regardless of how the filter coefficients are rounded, provided the sub-sample resolution is no less than $2^{-S}$.

Typically, however, meaningful values of a and b are small compared with the scale factor $2^S$. S is chosen to be small in order to speed computation. Table 17 shows the effective filter taps of the Catmull-Rom interpolator in 1/16-sample steps, with S chosen to be 5. For comparison, unrounded filter taps are also shown.

Filters for sub-sample shift x>½-sample are mirrored from filters for sub-sample shift 1−x. For symmetry, parameter a for a half-sample shift is zero, and b is zero for a full-sample shift. With mirroring, an entire family of N filters parameterized with 2*N parameters (a and b) can be represented by N small integers where the sub-sample resolution of the filter family is 1/N.

Tables 18, 19 and 20 show three other examples of 1/16-sample resolution filter families (referred to as Filter1, Filter2 and Filter3, respectively) with a scaling factor of 32 (S=5), parameterized as described above with a and b parameters.

TABLE 18

Filter1 filter family for 1/16-sample resolution

| Shift (1/16 sample units) | Parameters | | Effective filter taps | | | |
|---|---|---|---|---|---|---|
| | a | b | $h_0$ | $h_1$ | $h_2$ | $h_3$ |
| 0 | 0 | 0 | 0 | 32 | 0 | 0 |
| 1 | −1 | 0 | −1 | 32 | 1 | 0 |
| 2 | −1 | −1 | −2 | 31 | 4 | −1 |
| 3 | −1 | −1 | −2 | 29 | 6 | −1 |
| 4 | −1 | −2 | −3 | 28 | 9 | −2 |
| 5 | −1 | −2 | −3 | 26 | 11 | −2 |
| 6 | −1 | −3 | −4 | 25 | 14 | −3 |
| 7 | 0 | −3 | −3 | 21 | 17 | −3 |
| 8 | 0 | −3 | −3 | 19 | 19 | −3 |

TABLE 19

Filter2 filter family for 1/16-sample resolution

| Shift (1/16-sample units) | Parameters | | Effective filter taps | | | |
|---|---|---|---|---|---|---|
| | a | b | $h_0$ | $h_1$ | $h_2$ | $h_3$ |
| 0 | 0 | 0 | 0 | 32 | 0 | 0 |
| 1 | −1 | 0 | −1 | 32 | 1 | 0 |
| 2 | −1 | −1 | −2 | 31 | 4 | −1 |
| 3 | −2 | −1 | −3 | 31 | 5 | −1 |
| 4 | −1 | −3 | −4 | 29 | 10 | −3 |
| 5 | −1 | −3 | −4 | 27 | 12 | −3 |
| 6 | −1 | −4 | −5 | 26 | 15 | −4 |
| 7 | 0 | −5 | −5 | 23 | 19 | −5 |
| 8 | 0 | −4 | −4 | 20 | 20 | −4 |

TABLE 17

Parameterized Catmull-Rom filter family for 1/16-sample resolution

| Shift (1/16-sample units) | Unrounded filter taps | | | | Parameters | | Effective filter taps | | | |
|---|---|---|---|---|---|---|---|---|---|---|
| | $h_0$ | $h_1$ | $h_2$ | $h_3$ | a | b | $h_0$ | $h_1$ | $h_2$ | $h_3$ |
| 0 | 0 | 0 | 0 | 0 | 0 | 0 | 0 | 32 | 0 | 0 |
| 1 | −0.8789 | 31.6992 | 1.2383 | −0.0586 | −1 | 0 | −1 | 32 | 1 | 0 |
| 2 | −1.5313 | 30.8438 | 2.9063 | −0.2188 | −1 | 0 | −1 | 30 | 3 | 0 |
| 3 | −1.9805 | 29.5039 | 4.9336 | −0.457 | −1 | −1 | −2 | 29 | 6 | −1 |
| 4 | −2.25 | 27.75 | 7.25 | −0.75 | −1 | −1 | −2 | 27 | 8 | −1 |
| 5 | −2.3633 | 25.6523 | 9.7852 | −1.0742 | −1 | −1 | −2 | 25 | 10 | −1 |
| 6 | −2.3438 | 23.2813 | 12.4688 | −1.4063 | −1 | −1 | −2 | 23 | 12 | −1 |
| 7 | −2.2148 | 20.707 | 15.2305 | −1.7227 | 0 | −2 | −2 | 20 | 16 | −2 |
| 8 | −2 | 18 | 18 | −2 | 0 | −2 | −2 | 18 | 18 | −2 |

TABLE 20

Filter3 filter family for 1/16-sample resolution

| Shift (1/16-sample units) | Parameters | | Effective filter taps | | | |
|---|---|---|---|---|---|---|
| | a | b | $h_0$ | $h_1$ | $h_2$ | $h_3$ |
| 0 | 0 | 0 | 0 | 32 | 0 | 0 |
| 1 | −1 | 0 | −1 | 32 | 1 | 0 |
| 2 | −1 | −1 | −2 | 31 | 4 | −1 |
| 3 | −1 | −2 | −3 | 30 | 7 | −2 |
| 4 | −1 | −3 | −4 | 29 | 10 | −3 |
| 5 | −1 | −3 | −4 | 27 | 12 | −3 |
| 6 | −1 | −3 | −4 | 25 | 14 | −3 |
| 7 | 0 | −5 | −5 | 23 | 19 | −5 |
| 8 | 0 | −4 | −4 | 20 | 20 | −4 |

3. Proposed Syntax and Decoding Process

This section describes example bitstream syntax and semantics for a and b parameters of parameterized filters according to the second approach. In the example bitstream syntax and semantics, the resolution is set at 1/16 and the number of signaled filters is eight (with the rest calculated by mirroring) or nine if an integer position filter is present. The scaling factor is known at the decoder and not signaled.

Alternatively, a and b parameters of parameterized filters are encoded, signaled, and decoded according to other techniques (e.g., using different entropy encoding/decoding, signaling more or fewer syntax elements). Or, other parameters are signaled, for example, for resolution and/or scaling factor. Aspects of the syntax and semantics described in this section can also be applied to encode, signal, and decoder filters parameterized according to the first approach.

Filter information can be signaled in an encoded bitstream. By signaling the information in a bitstream, an encoder can communicate filter information to a decoder. The decoder can process the filter information during decoding and can make decoding decisions (e.g., selecting filters for resampling) based on the communicated information.

Filter information can be signaled at different levels or layers in a bitstream. For example, in one implementation, one or more filters can be signaled at sequence level of a bitstream. When multiple filters are signaled at the sequence level, a filter index is signaled (e.g., in each slice) to specify which filter is to be applied (e.g., for prediction between a specific base picture and a current slice).

Tables 21 and 22 show selected portions of a bitstream syntax used in one implementation. Descriptions of some of the syntax elements shown in Table 21 and 22 are provided below, along with example processing rules that can be used when processing the syntax elements at a decoder.

TABLE 21

Selected portions of sequence-level bitstream syntax.

| seq_parameter_set_svc_extension( ) { | Descriptor |
|---|---|
| ... | |
|   if( extended_spatial_scalability > 0 ) { | |
|     ... | |
|   } | |
|   num_resample_filters_minus1 | ue(v) |
|   for( resample_filter_idx = 0; resample_filter_idx <= | |
|     num_resample_filters_minus1; resample_filter_idx++ ) { | |
|     integer_pos_filter_present_flag | u(1) |
|     if(!integer_pos_filter_present_flag) { | |
|       resample_filter_param_a[resample_filter_idx][0] = 0 | |
|     } | |
|     resample_filter_param_a[resample_filter_idx][8] = 0 | |
|     resample_filter_param_b[resample_filter_idx][0] = 0 | |
|     for( k = 7; k >= !integer_pos_filter_present_flag; k-- ) { | |
|       resample_filter_param_a[resample_filter_idx][k] | se(v) |
|       if( k == 6 ) | |
|         resample_filter_param_a[resample_filter_idx][6] += | |
|           resample_filter_param_a[resample_filter_idx][7] | |
|       else if (k < 6) | |
|         resample_filter_param_a[resample_filter_idx][k] += | |
|           2 * resample_filter_param_a[resample_filter_idx][k + 1] − | |
|           resample_filter_param_a[resample_filter_idx][k + 2] | |
|     } | |
|     for( k = 1; k <= 8; k++ ) { | |
|       resample_filter_param_b[resample_filter_idx][k] | se(v) |
|       if( k == 2 ) | |
|         resample_filter_param_b[resample_filter_idx][2] += | |
|           resample_filter_param_b[resample_filter_idx][1] | |
|       else if (k > 2) | |
|         resample_filter_param_b[resample_filter_idx][k] += | |
|           2 * resample_filter_param_b[resample_filter_idx][k − 1] − | |
|           resample_filter_param_b[resample_filter_idx][k − 2] | |
|     } | |
|   } | |
|   ... | |
| } | |

TABLE 22

Selected portions of slice-level bitstream syntax.

| slice_header_in_scalable_extension( ) { | C | Descriptor |
|---|---|---|
| ... | | |
| if( slice_type != PR && | | |
| extended_spatial_scalability > 0 ) { | | |
| ... | | |
| } | | |
| if( num_resample_filters > 1 ) | | |
| resample_filter_idx | 2 | ue(v) |
| ... | | |
| ... | | |
| } | | | num_resample_filters_minus1 specifies the number of sets of resampling filters presented in the current sequence parameter set. The descriptor "ue(v)" indicates that num_resample_filters_minus1 is an unsigned integer Exp-Golomb-coded syntax element with the left bit first, but this element may be coded in other ways. The value of num_resample_filters_minus1 is in the range of 0 to 15, inclusive. The actual number of sets of sets of resampling filters is in the range of 1 to 16, inclusive.

integer_pos_filter_present_flag specifies whether resampling filter parameters for integer sample positions are present for the set of filters indicated by resample_filter_idx. The descriptor "u(1)" indicates that integer_pos_filter_present_flag is an unsigned integer using 1 bit, but this element may be coded in other ways. If integer_pos_filter_present_flag=1, the filter parameters are present. If integer_pos_filter_present_flag=0, the filter parameters are absent and their values are equal to 0.

resample_filter_param_a[resample_filter_idx][k] and resample_filter_param_b[resample_filter_idx][k] specify the a and b parameters, respectively, of the $k^{th}$ filter in a filter set indicated by a resampling filter index (resample_filter_idx), which is explained in detail below. As shown, some of the a and b parameters are implied, not signaled. For example, resample_filter_param_a[resample_filter_idx][8]=0
and resample_filter_param_b[resample_filter_idx][0]=0.

The descriptor "se(v)" indicates that the signaled values for resample_filter_param_a and resample_filter_param_b are signed integer Exp-Golomb-coded syntax elements, but these elements may be coded in other ways. The signaled values are differentially coded using 2DDC, and resample_filter_param_a and resample_filter_param_b are used as follows.

For the a parameter, values are signaled in decreasing order from the ½-sample shift position. The value for k=7 is signaled as an absolute value. The value of a for k=6 (⅜-sample shift) is signaled as a differential relative to the k=7 value and is reconstructed as:

resample_filter_param_a[resample_filter_idx][6] +=
resample_filter_param_a[resample_filter_idx][7].

For lower values of k, the value for the parameter a is reconstructed as:

resample_filter_param_a[resample_filter_idx][k] +=
2 * resample_filter_param_a[resample_filter_idx][k + 1] –
resample_filter_param_a[resample_filter_idx][k + 2].

The values for the b parameter are similarly reconstructed in increasing order from the lowest shift position.

From the reconstructed parameters a and b, the decoder can reconstruct the four filter taps for a filter k for a particular offset in the family.

Let intermediate variable a=resample_filter_param_a[resample_filter_idx][k] and intermediate variable b=resample_filter_param_b[resample_filter_idx][k]. For the $k^{th}$ filter in the filter set indicated by the resample_filter_idx, resample_filter[resample_filter_idx][k][j] with k=0 . . . 8 and j=0 . . . 3, are derived as follows.

resample_filter[resample_filter_*idx][k][*0]=*a+b* resample_filter[resample_filter_*idx][k][*1]=32−2\*k−2\*a−b* resample_filter[resample_filter_*idx][k][*2]=2\*k+a−b* resample_filter[resample_filter_idx][k][3]=b resample_filter[resample_filter_idx][k][j] with k=9 . . . 15 and j=0 . . . 3, are derived as follows.

resample_filter[resample_filter_*idx][k][j]*=resample_filter[resample_filter_*idx][*16−*k][*3−*j]* resample_filter_idx specifies filter k in a set of filters that is applied to a luma texture upsampling process for a current slice. The descriptor "ue(v)" indicates that resample_filter_idx is an unsigned integer Exp-Golomb-coded syntax element, but this element may be coded in other ways. When resample_filter_idx is not present, it is inferred to be equal to 0.

resample_filter_idx is used as follows.

Let filter_array[k][i] be a data array containing all the filter coefficients for a family of filters, with k=0 . . . 15 and i=0 . . . 3. filter_array[k][i] shall be derived as follows.

filter_array[*k][i]*=Resample_filter[resample_filter_*idx][k][i]*

Alternatively, resampling filter information is signaled in different ways. For example, resampling filter information can be signaled at different syntax levels (e.g., picture level) and/or using different syntax elements or syntax rules.

3. Experiments

The following section describes experimental results. A specific set of filters is applied as an example for the described experiments. The derived filter coefficients are listed in Table 18, Table 19 and Table 20, above.

Dyadic with All Intra Coding

On Common Intermediate Format ("CIF") sequences, Filter1 outperforms other 4-tap filters by 0.03 dB on average. Filter1 performs as well as a six-tap filter on CIF sequences, thus regaining some of the performance advantage of a six-tap design. Dyadic coding of 4CIF sequences shows similar results, where Filter1 outperforms the current four-tap design, while regaining the performance advantage of the six-tap design.

Non-Dyadic with All Intra Coding

For the non-dyadic cases, three different filters are used based on the upsampling ratio. Filter1 is used for the ESS ¾ upsampling case, Filter2 is used for ESS ⅔ upsampling and Filter3 is used for ESS ⅗ upsampling. The performance of the proposed flexible framework was compared with a fixed four-tap design. The performance of the proposed flexible framework also was compared with a six-tap design. The results showed that the flexible approach outperforms a fixed four-tap filter design and can regain some of the performance advantage of a six-tap design.

Having described and illustrated the principles of our invention with reference to various described embodiments, it will be recognized that the described embodiments can be modified in arrangement and detail without departing from such principles. It should be understood that the programs, processes, or methods described herein are not related or limited to any particular type of computing environment, unless indicated otherwise. Various types of general purpose or specialized computing environments may be used with or perform operations in accordance with the teachings described herein. Elements of the described embodiments shown in software may be implemented in hardware and vice versa.

In view of the many possible embodiments to which the principles of our invention may be applied, we claim as our invention all such embodiments as may come within the scope and spirit of the following claims and equivalents thereto.

We claim:

1. A method of filtering media information, the method comprising, with a computing device that implements a media processing tool:
receiving filter information for one or more filters, wherein the filter information is signaled in a bitstream received by the computing device that implements the media processing tool, and wherein the filter information includes:
one or more filter family parameters selected from the group comprising number of filters parameter, resolution parameter, scaling bits parameter, and full integer position filter present parameter; and
for each of the one or more filters, one or more signaled filter parameters used to determine one or more filter coefficient parameters from which plural filter taps are calculated;
for each of the one or more filters, calculating the plural filter taps for the filter using the filter information, wherein the plural filter taps for the filter are specified by the one or more filter coefficient parameters for the filter, and wherein the plural filter taps are greater in number than the one or more filter coefficient parameters from which the plural filter taps are calculated; and
filtering media information using the one or more filters.

2. The method of claim 1 wherein the one or more filters comprise filters with different phases or fractional sample delays in a filter family.

3. The method of claim 2 wherein the one or more filter coefficient parameters consist of two parameters for each of the one or more filters.

4. The method of claim 1 wherein the one or more filter coefficient parameters are calculated by:
identifying a constraint for the filter; and
based on the identified constraint, identifying the one or more filter coefficient parameters.

5. The method of claim 4 wherein the identifying the constraint comprises identifying a constraint matrix for the filter, and wherein the constraint matrix constrains the filter to be a linear interpolator.

6. A method of upsampling spatially scalable video information, the method comprising, with a computing device that implements a video processing tool:
receiving upsampling filter information for plural upsampling filters,
using the upsampling filter information, determining at least two effective filter tap calculation parameters for each of the plural upsampling filters;
receiving encoded video sample information; and
upsampling the video sample information using the plural upsampling filters, each of the plural upsampling filters having at least four filter taps, wherein for each of the plural upsampling filters:
the at least four filter taps are calculated with the at least two effective filter tap calculation parameters prior to the upsampling, and
the at least four filter taps are greater in number than the at least two effective filter tap calculation parameters from which the plural filter taps are calculated.

7. The method of claim 6 wherein each of the plural upsampling filters is a $\frac{1}{16}$-sample resolution upsampling filter.

8. A method comprising, with a computing device that implements a media processing tool:
signaling filter information in a bitstream, wherein the filter information comprises information for a set of plural filters in a filter family, wherein each of the plural filters comprises plural filter taps, and wherein the signaling of the filter information comprises:
signaling one or more family parameters for the filter family; and
for each of the plural filters, signaling one or more filter tap parameters from which the plural filter taps of the filter can be derived, wherein the one or more filter tap parameters for the filter are fewer in number than the plural filter taps of the filter.

9. The method of claim 8 wherein the one or more family parameters include a number of filters in the set of plural filters.

10. The method of claim 8 wherein the one or more family parameters include a resolution parameter.

11. The method of claim 8 wherein the one or more family parameters include a scaling bits parameter.

12. The method of claim 8 wherein the one or more family parameters include one or more of a resolution parameter, a scaling bits parameter, and a number of filters parameter, and wherein any of the resolution parameter, the scaling bits parameter and the number of filters that is not signaled is implied.

13. The method of claim 8 wherein the one or more family parameters include a integer position filter present parameter that indicates whether or not the plural filters for which one or more filter tap parameters are signaled include an integer position filter.

14. The method of claim 8 wherein the plural filters are usable for resampling and/or sub-sample interpolation in motion compensation.

15. The method of claim 8 wherein the filter family further includes plural mirrored filters, each of the plural mirrored filters having plural filter taps derived from the plural filter taps of one of the plural filters for which filter information is signaled.

16. The method of claim 8 further comprising, before the signaling the one or more filter tap parameters, differentially coding the filter tap parameters for at least one of the plural filters relative to the filter tap parameters of another of the plural filters such that the signaled filter tap parameters are differentially coded values for the at least one of the plural filters.

17. The method of claim 16 wherein the differential coding is second degree differential coding.

18. The method of claim 8 further comprising, before the signaling the one or more filter tap parameters, fixed-length coding the one or more filter tap parameters.

19. The method of claim 8 further comprising, before the signaling the one or more filter tap parameters, variable-length coding the one or more filter tap parameters.

20. A method of filtering media information, the method comprising, with a computing device that implements a media processing tool:
receiving filter information for one or more filters, wherein the filter information is signaled in a bitstream received by the computing device that implements the media processing tool, and wherein the one or more filters comprise filters with different phases or fractional sample delays in a filter family;
for each of the one or more filters, calculating plural filter taps using the filter information, wherein the plural filter taps for the filter are specified by one or more filter coefficient parameters for the filter, and wherein the plural filter taps are greater in number than the one or more filter coefficient parameters from which the plural filter taps are calculated; and
filtering media information using the one or more filters.

21. The method of claim 20 wherein the one or more filter coefficient parameters consist of two parameters for each of the one or more filters.

22. A method of filtering media information, the method comprising, with a computing device that implements a media processing tool:
receiving filter information for one or more filters, wherein the filter information is signaled in a bitstream received by the computing device that implements the media processing tool;
for each of the one or more filters, calculating plural filter taps using the filter information, wherein the plural filter taps for the filter are specified by one or more filter coefficient parameters for the filter, wherein the plural filter taps are greater in number than the one or more filter coefficient parameters from which the plural filter taps are calculated, and wherein the one or more filter coefficient parameters are calculated by:
identifying a constraint for the filter; and
based on the identified constraint, identifying the one or more filter coefficient parameters; and
filtering media information using the one or more filters.

23. The method of claim 22 wherein the identifying the constraint comprises identifying a constraint matrix for the filter, and wherein the constraint matrix constrains the filter to be a linear interpolator.

24. A computing device that implements a media processing tool, the computing device comprising a processor, memory, and computer-readable storage media storing computer-executable instructions for causing the computing device that implements the media processing tool to perform a method of filtering media information, the method comprising:
receiving filter information for one or more filters, wherein the filter information is signaled in a bitstream received by the computing device that implements the media processing tool, and wherein the filter information includes:
one or more filter family parameters selected from the group comprising number of filters parameter, resolution parameter, scaling bits parameter, and full integer position filter present parameter; and
for each of the one or more filters, one or more signaled filter parameters used to determine one or more filter coefficient parameters from which plural filter taps are calculated;
for each of the one or more filters, calculating the plural filter taps for the filter using the filter information, wherein the plural filter taps for the filter are specified by the one or more filter coefficient parameters for the filter, and wherein the plural filter taps are greater in number than the one or more filter coefficient parameters from which the plural filter taps are calculated; and
filtering media information using the one or more filters.

25. The computing device of claim 24 wherein the one or more filters comprise filters with different phases or fractional sample delays in a filter family.

26. A computing device that implements a media processing tool, the computing device comprising a processor, memory, and computer-readable storage media storing computer-executable instructions for causing the computing device that implements the media processing tool to perform a method comprising:
signaling filter information in a bitstream, wherein the filter information comprises information for a set of plural filters in a filter family, wherein each of the plural filters comprises plural filter taps, and wherein the signaling of the filter information comprises:
signaling one or more family parameters for the filter family; and
for each of the plural filters, signaling one or more filter tap parameters from which the plural filter taps of the filter can be derived, wherein the one or more filter tap parameters for the filter are fewer in number than the plural filter taps of the filter.

27. The computing device of claim 26 wherein the one or more family parameters include one or more of a resolution parameter, a scaling bits parameter, and a number of filters parameter, and wherein any of the resolution parameter, the scaling bits parameter and the number of filters that is not signaled is implied.

28. The computing device of claim 26 wherein the one or more family parameters include a integer position filter present parameter that indicates whether or not the plural filters for which one or more filter tap parameters are signaled include an integer position filter.

29. The computing device of claim 26 wherein the filter family further includes plural mirrored filters, each of the plural mirrored filters having plural filter taps derived from the plural filter taps of one of the plural filters for which filter information is signaled.

30. The computing device of claim 26 further comprising, before the signaling the one or more filter tap parameters, differentially coding the filter tap parameters for at least one of the plural filters relative to the filter tap parameters of another of the plural filters such that the signaled filter tap parameters are differentially coded values for the at least one of the plural filters.

31. A computing device that implements a media processing tool, the computing device comprising a processor, memory, and computer-readable storage media storing computer-executable instructions for causing the computing device that implements the media processing tool to perform a method of filtering media information, the method comprising:
receiving filter information for one or more filters, wherein the filter information is signaled in a bitstream received by the computing device that implements the media processing tool, and wherein the one or more filters comprise filters with different phases or fractional sample delays in a filter family;

for each of the one or more filters, calculating plural filter taps using the filter information, wherein the plural filter taps for the filter are specified by one or more filter coefficient parameters for the filter, and wherein the plural filter taps are greater in number than the one or more filter coefficient parameters from which the plural filter taps are calculated; and filtering media information using the one or more filters.

* * * * *